(12) United States Patent
Chang et al.

(10) Patent No.: US 11,929,261 B2
(45) Date of Patent: Mar. 12, 2024

(54) SEMICONDUCTOR PACKAGE AND METHOD OF MANUFACTURING THE SAME

(71) Applicant: Taiwan Semiconductor Manufacturing Co., Ltd., Hsinchu (TW)

(72) Inventors: Chin-Chuan Chang, Zhudong Township (TW); Szu-Wei Lu, Hsinchu (TW); Chen-Hua Yu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 30 days.

(21) Appl. No.: 17/097,857

(22) Filed: Nov. 13, 2020

(65) Prior Publication Data

US 2021/0343547 A1  Nov. 4, 2021

Related U.S. Application Data

(60) Provisional application No. 63/018,595, filed on May 1, 2020.

(51) Int. Cl.
| | |
|---|---|
| *H01L 21/56* | (2006.01) |
| *H01L 21/78* | (2006.01) |
| *H01L 23/00* | (2006.01) |
| *H01L 23/538* | (2006.01) |
| *H01L 25/065* | (2023.01) |

(52) U.S. Cl.
CPC .......... *H01L 21/561* (2013.01); *H01L 21/568* (2013.01); *H01L 21/78* (2013.01); *H01L 23/5389* (2013.01); *H01L 24/05* (2013.01); *H01L 24/13* (2013.01); *H01L 25/0655* (2013.01); *H01L 2224/0233* (2013.01); *H01L 2224/02379* (2013.01); *H01L 2224/04105* (2013.01); *H01L 2924/15311* (2013.01); *H01L 2924/181* (2013.01)

(58) Field of Classification Search
None
See application file for complete search history.

(56) References Cited

U.S. PATENT DOCUMENTS

| | | | |
|---|---|---|---|
| 8,361,842 B2 | 1/2013 | Yu et al. | |
| 8,680,647 B2 | 3/2014 | Yu et al. | |
| 8,703,542 B2 | 4/2014 | Lin et al. | |

(Continued)

FOREIGN PATENT DOCUMENTS

| | | |
|---|---|---|
| CN | 108630676 A | 10/2018 |
| JP | 2007317822 A | 12/2007 |

(Continued)

*Primary Examiner* — Jay C Chang
(74) *Attorney, Agent, or Firm* — Slater Matsil, LLP

(57) ABSTRACT

A method includes forming a set of through-vias in a substrate, the set of through-vias partially penetrating a thickness of the substrate. First connectors are formed over the set of through-vias on a first side of the substrate. The substrate is singulated to form dies. The first side of the dies are attached to a carrier. The dies are thinned from the second side to expose the set of through-vias. Second connectors are formed over the set of through-vias on the second side of the dies. A device die is bonded to the second connectors. The dies and device dies are singulated into multiple packages.

20 Claims, 24 Drawing Sheets

(56) References Cited

U.S. PATENT DOCUMENTS

| | | |
|---|---|---|
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 10,510,668 B1 | 12/2019 | Chen et al. |
| 11,189,603 B2 | 11/2021 | Yu et al. |
| 2001/0054771 A1* | 12/2001 | Wark .................. H01L 24/13 |
| | | 257/E21.511 |
| 2007/0287265 A1* | 12/2007 | Hatano ................ H01L 24/97 |
| | | 257/E21.597 |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2016/0148903 A1 | 5/2016 | Su et al. |
| 2016/0276235 A1 | 9/2016 | Chen |
| 2018/0138151 A1 | 5/2018 | Shih et al. |
| 2018/0158749 A1 | 6/2018 | Yu et al. |
| 2018/0204791 A1* | 7/2018 | Chen .................. H01L 25/0652 |
| 2019/0006194 A1* | 1/2019 | Lin ..................... H01L 24/19 |
| 2019/0244947 A1 | 8/2019 | Yu et al. |
| 2020/0027750 A1 | 1/2020 | Wei et al. |
| 2020/0105689 A1 | 4/2020 | Hwang et al. |
| 2021/0257339 A1 | 8/2021 | Yu et al. |

FOREIGN PATENT DOCUMENTS

| | | |
|---|---|---|
| JP | 2018026442 A | 2/2018 |
| KR | 20160063241 A | 6/2016 |
| KR | 20160111298 A | 9/2016 |
| TW | 201919123 A | 5/2019 |
| TW | 202008530 A | 2/2020 |

* cited by examiner

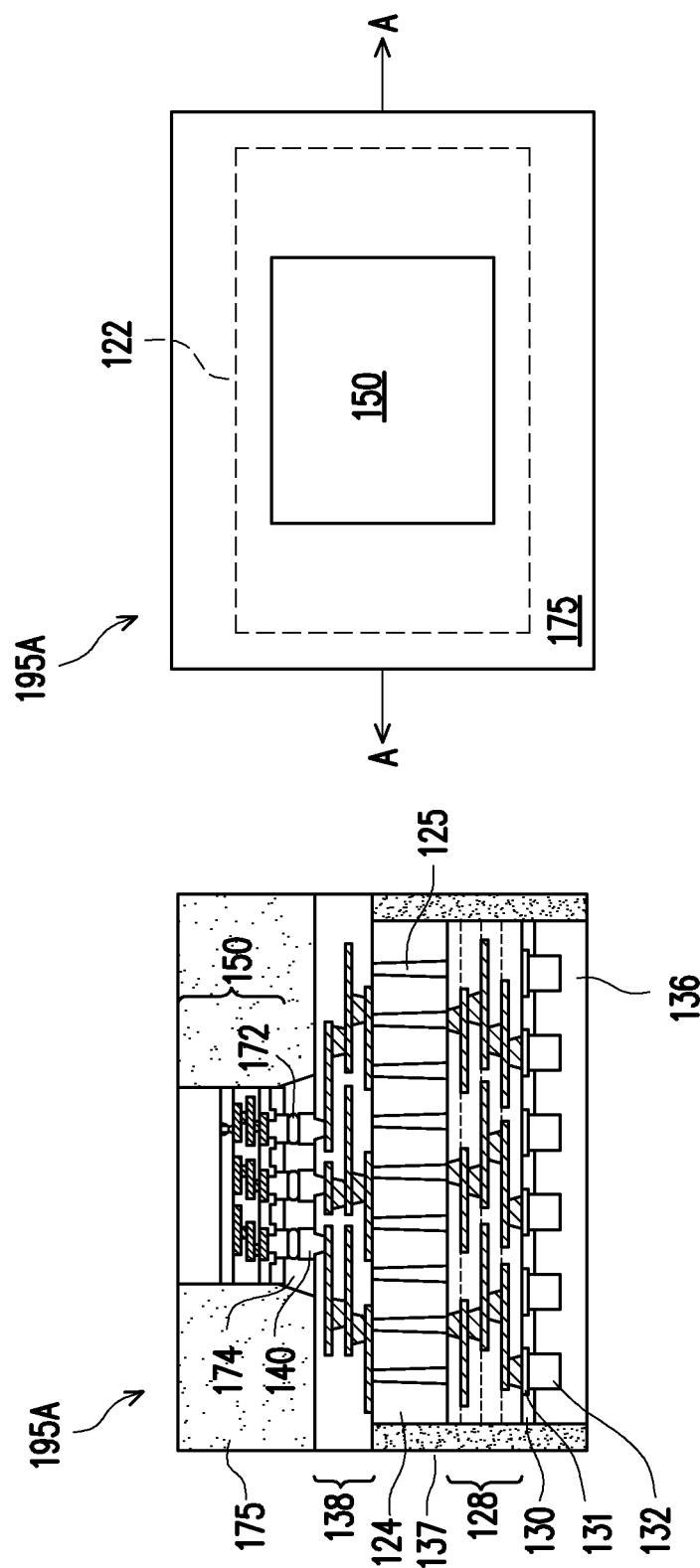

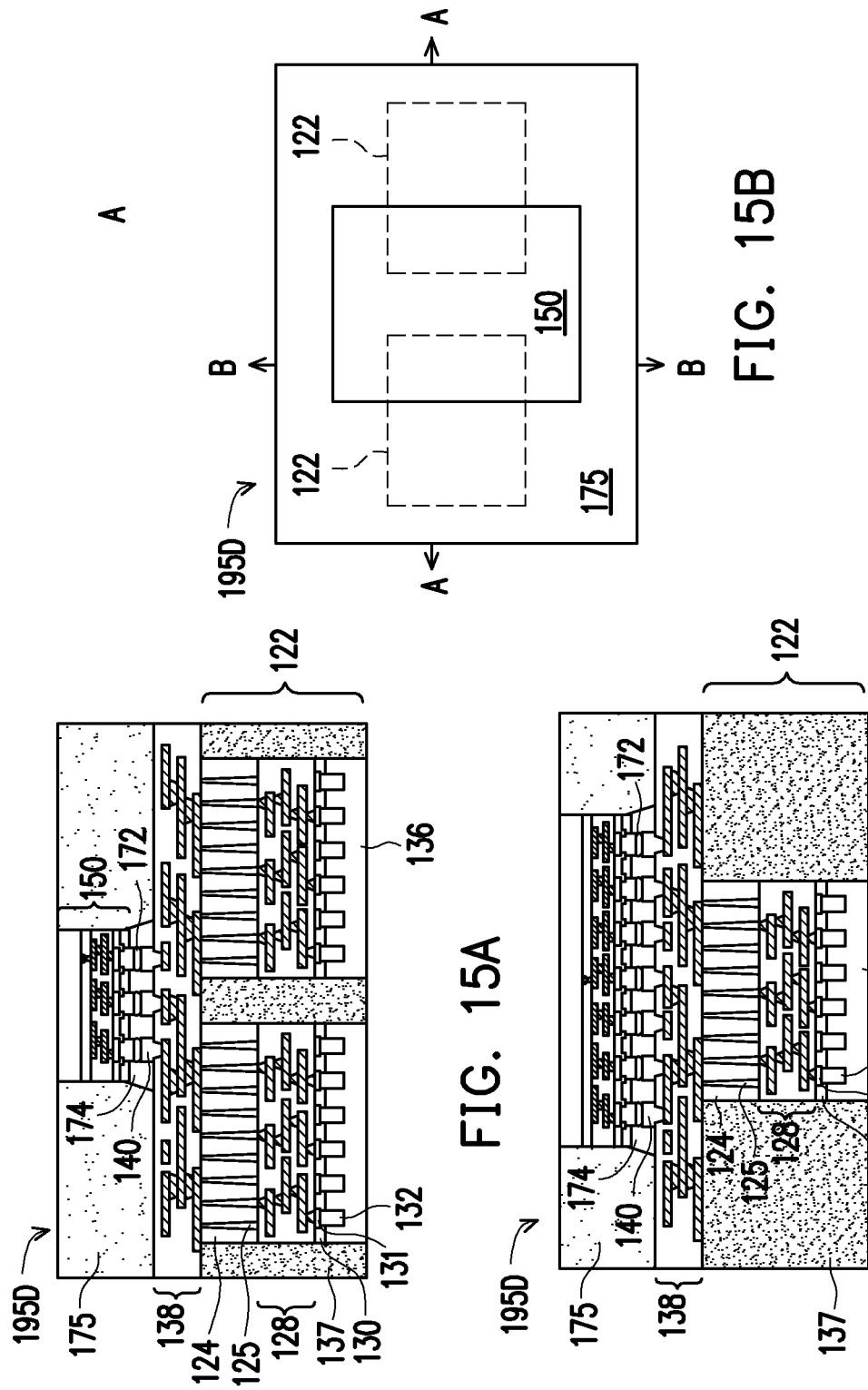

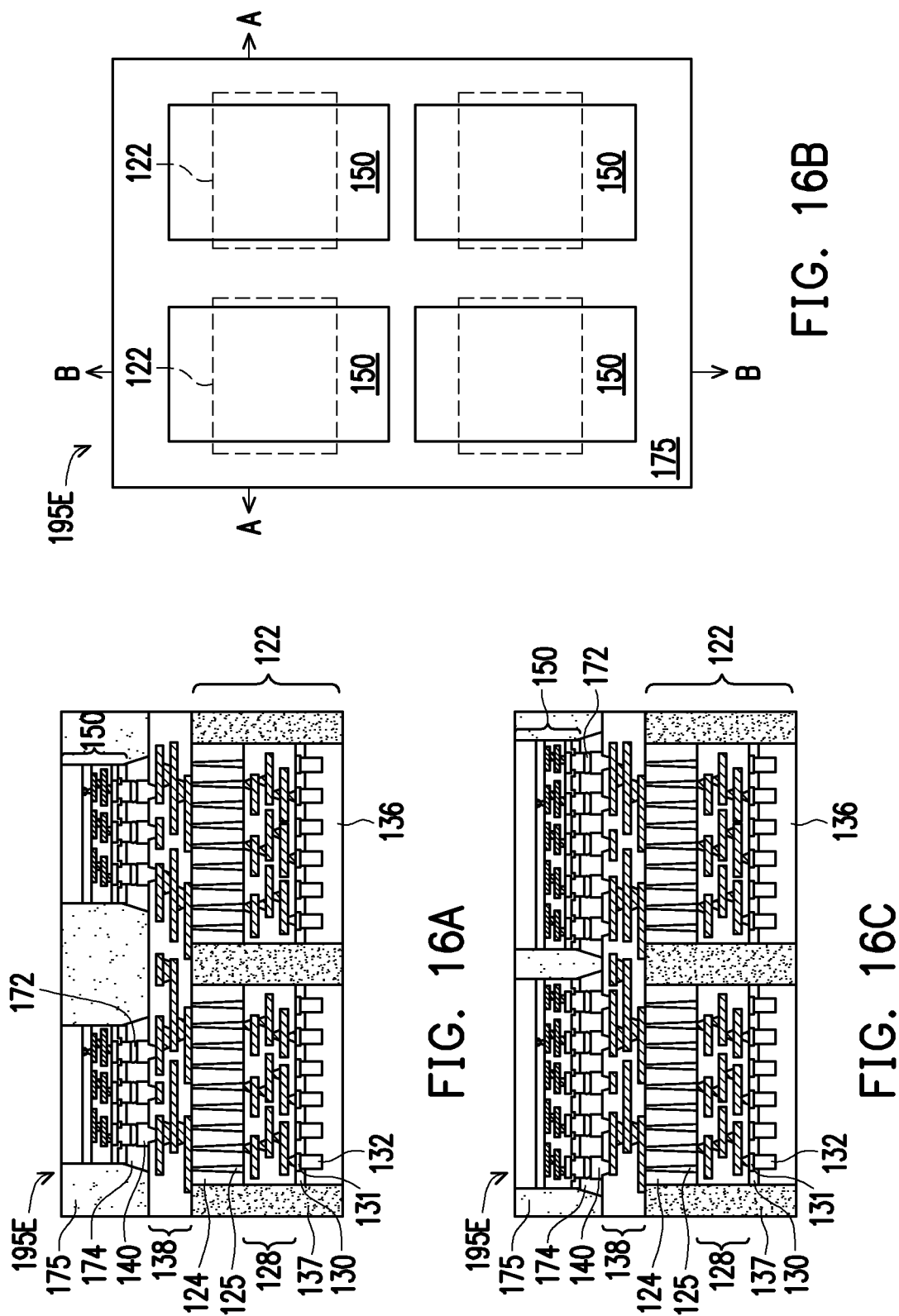

SEMICONDUCTOR PACKAGE AND METHOD OF MANUFACTURING THE SAME

PRIORITY CLAIM AND CROSS-REFERENCE

This application claims the benefit of the following provisionally filed U.S. Patent application: Application No. 63/018,595, filed on May 1, 2020 and entitled "Semiconductor Package and Method of Manufacturing the Same" which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 11, 12A, 12B, 13A, 13B, 14A, 14B, 15A, 15B, 15C, 16A, 16B, and 16C illustrate the cross-sectional views of intermediate stages in the formation of a chiplet die stack, in accordance with some embodiments.

DETAILED DESCRIPTION

Figure 1:
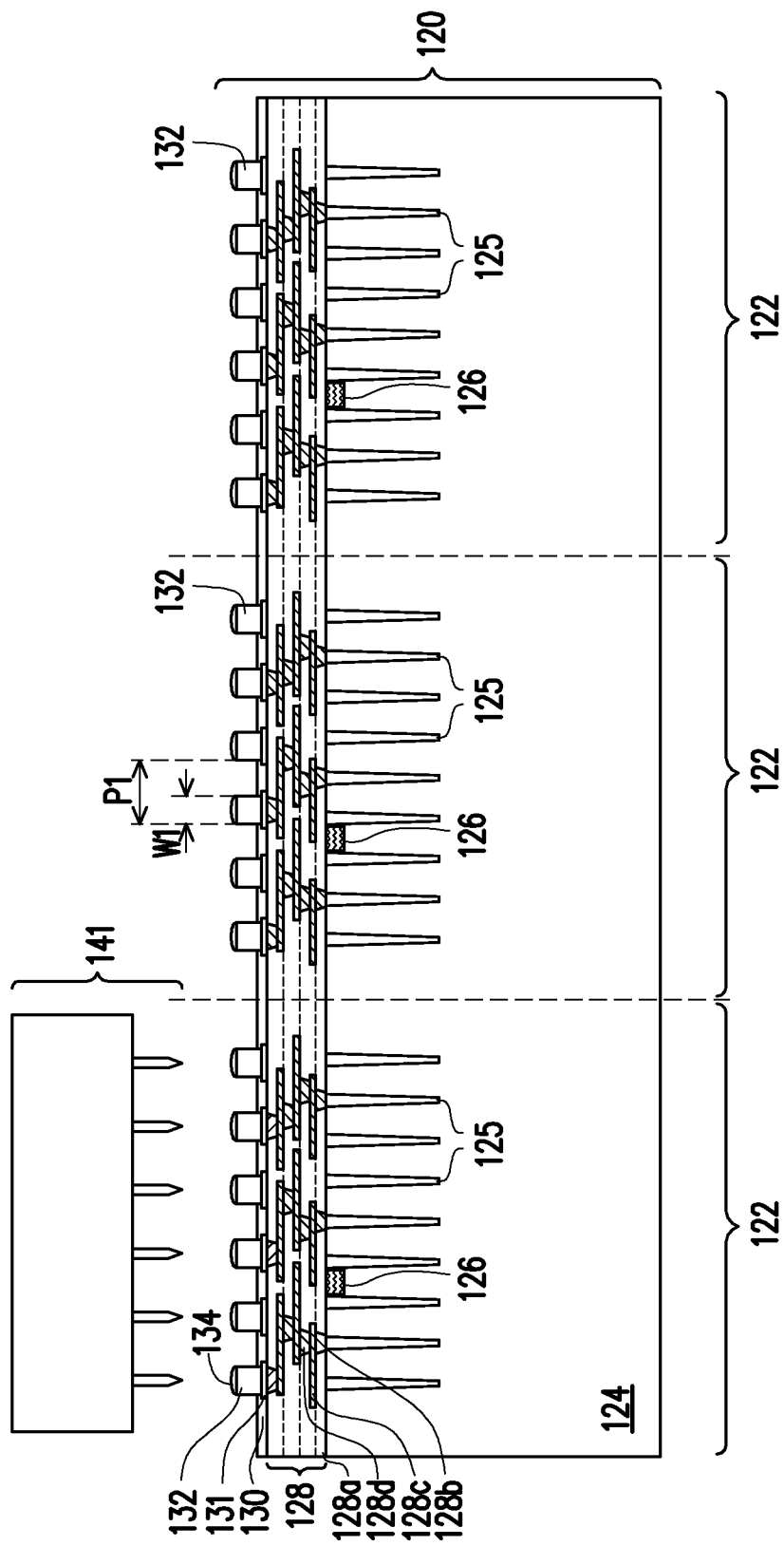

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A die stack and the processes of forming the die stack are provided in accordance with some embodiments. As technology develops, the sizes of device dies has decreased at least in part by fitting similar components into smaller spaces. Device dies may be combined into a package format so that different functional aspects of the package, e.g., processors, memory, sensors, antennas, and so forth, are brought physically close together into a single package. One such package format may be referred to as a chiplet. As used herein, a chiplet may be understood to be a particular type of die stack, being a package of various device dies which brings together the particular functions of the various device dies. The resulting chiplet can then be used in much the same way as a device die may be used. Even if the resulting structures brought about by the embodiments described herein are referred to as a chiplet, it should be understood that embodiments may be applicable to any die stack.

Because of the downsizing of device dies in advanced technology nodes, forming a chiplet using such device dies (or mix of device dies from different technology nodes) requires increasing control over manufacturing tolerances. Embodiments of the present disclosure utilize a front side planarization technique to achieve total thickness variation of less than 3 μm of a set of through-vias. Whereas device dies may be mounted to a front side of an interposer, then the reverse side of the interposer thinned to expose a set of through silicon vias, embodiments instead flip the interposer, thin the interposer to expose the through-silicon vias, and then mount the device die to the back (now front) of the interposer. By this process, total thickness variation of less than 3 μm may be achieved. Embodiments discussed herein are used to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 23:
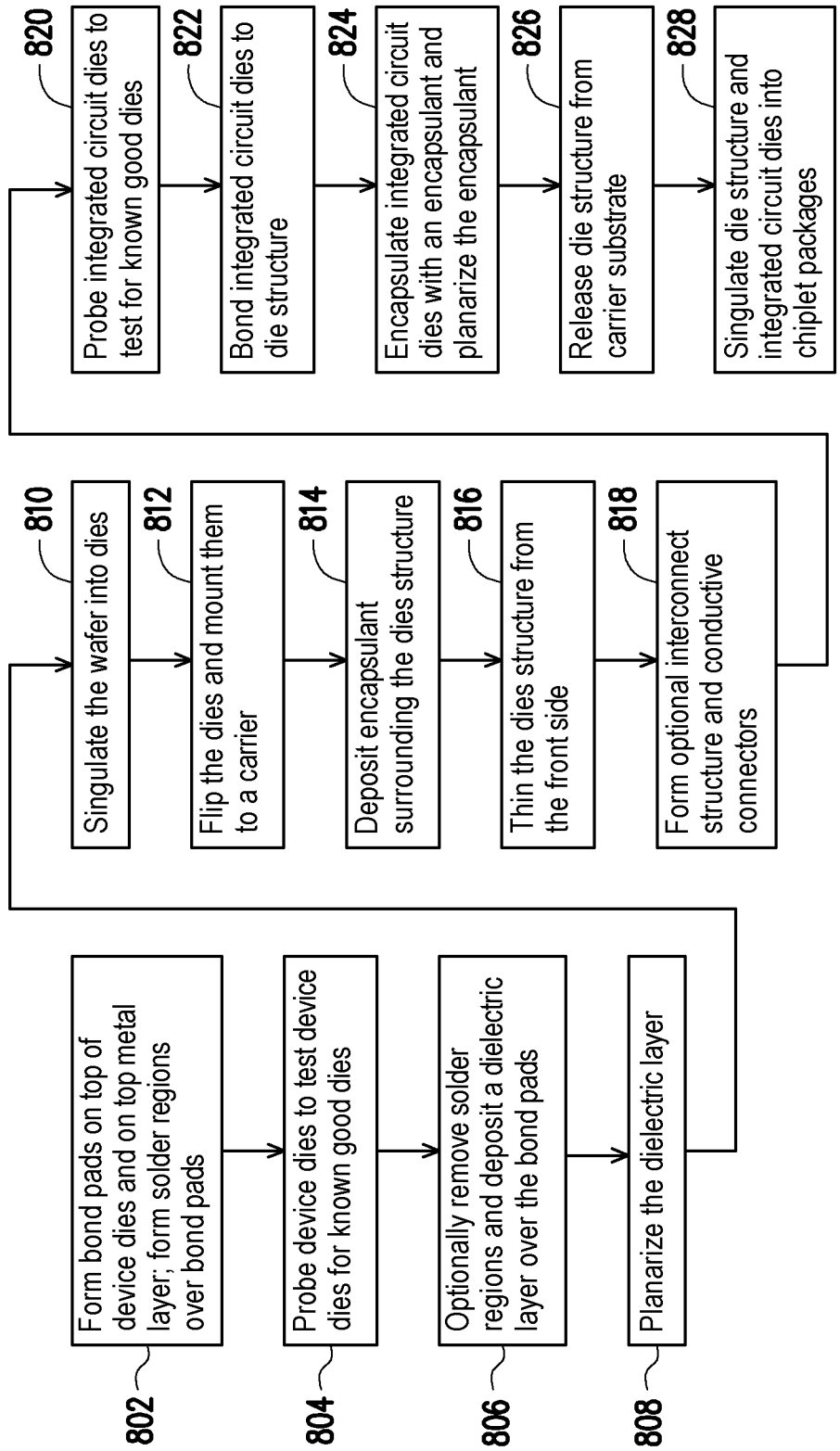
FIG. 23 illustrates a process flow for forming a chiplet die stack, in accordance with some embodiments.

FIGS. 1 through 11, 12A, 12B, 13A, 13B, 14A, 14B, 15A, 15B, 15C, 16A, 16B, and 16C illustrate the cross-sectional views of intermediate stages in the formation of a chiplet die stack in accordance with some embodiments of the present disclosure. The corresponding processes are reflected schematically in the process flow as shown in FIG. 23.

FIG. 1 illustrates a cross-sectional view of wafer 120. Wafer 120 may include a plurality of device dies 122 therein, with a series of three of the device dies 122 illustrated as an example. The plurality of device dies 122 may have identical designs. In accordance with some embodiments of the present disclosure, wafer 120 is an interposer wafer and each of the device dies 122 are interposers. The interposer device dies 122 may include optional active and/or passive devices, which are illustrated as integrated circuit devices 126. Views of integrated circuit devices 126 are omitted in other Figures for simplicity.

In accordance with some embodiments, device dies 122 are logic dies, which may be Application Specific Integrated Circuit (ASIC) dies, Field Programmable Gate Array (FPGA) dies, or the like. For example, device dies 122 may be Central Processing Unit (CPU) dies, Graphic Processing Unit (GPU) dies, or the like.

In accordance with some embodiments of the present disclosure, device die 122 includes semiconductor substrate 124. Semiconductor substrate 124 may be formed of crystalline silicon, crystalline germanium, silicon germanium, or a III-V compound semiconductor such as GaN, GaAsP, AlInAs, AlGaAs, GaInAs, GaInP, GaInAsP, or the like. Semiconductor substrate 124 may also be a bulk semiconductor substrate or a Semiconductor-On-Insulator (SOI) substrate. Shallow Trench Isolation (STI) regions (not shown) may be formed in semiconductor substrate 124 to isolate the active regions in semiconductor substrate 124.

Through-vias (sometimes referred to as through-silicon vias or through-semiconductor vias) 125 are formed to extend into semiconductor substrate 124, wherein through-vias 125 are used to electrically inter-couple the features on the opposite sides of device die 122. Through-vias 125 are electrically connected to the overlying bond pads 132.

In accordance with some embodiments of the present disclosure, integrated circuit devices 126 may include Complementary Metal-Oxide Semiconductor (CMOS) transistors, resistors, capacitors, diodes, and the like. Some of integrated circuit devices 126 may be formed at a top surface of semiconductor substrate 124. The details of integrated circuit devices 126 are not illustrated herein.

Interconnect structure 128 is formed over semiconductor substrate 124. In accordance with some embodiments, interconnect structure 128 includes an Inter-Layer Dielectric (ILD) 128a over semiconductor substrate 124 and filling the space between the gate stacks of transistors (not shown) in integrated circuit devices 126. In accordance with some embodiments, the ILD 128a is formed of Phospho Silicate Glass (PSG), Boro Silicate Glass (BSG), Boron-doped Phospho Silicate Glass (BPSG), Fluorine-doped Silicate Glass (FSG), silicon oxide, or the like. In accordance with some embodiments of the present disclosure, the ILD is formed using a deposition method such as Plasma-Enhanced Chemical Vapor Deposition (PECVD), Low Pressure Chemical Vapor Deposition (LPCVD), spin-on coating, Flowable Chemical Vapor Deposition (FCVD), or the like.

Contact plugs 128b are formed in the ILD 128a, and are used to electrically connect integrated circuit devices 126 and through-vias 125 to overlying metal lines and vias. In accordance with some embodiments of the present disclosure, the contact plugs 128b are formed of a conductive material selected from tungsten, aluminum, copper, titanium, tantalum, titanium nitride, tantalum nitride, alloys therefore, and/or multi-layers thereof. The formation of the contact plugs 128b may include forming contact openings in the ILD 128a, filling a conductive material(s) into the contact openings, and performing a planarization process (such as a Chemical Mechanical Polish (CMP) process or a mechanical grinding process) to level the top surfaces of the contact plugs 128b with the top surface of the ILD 128a.

Interconnect structure 128 may further include a plurality of dielectric layers over the ILD 128a and the contact plugs. Metal lines 128c and vias 128d are formed in the dielectric layers (also referred to as Inter-Metal Dielectrics (IMDs)). The metal lines at a same level are collectively referred to as a metal layer hereinafter. In accordance with some embodiments of the present disclosure, interconnect structure 128 includes a plurality of metal layers, each including a plurality of metal lines 128c at the same level. The metal lines 128c in neighboring metal layers are interconnected through the vias 128d. The metal lines 128c and vias 128d may be formed of copper or copper alloys, and they can also be formed of other metals. In accordance with some embodiments of the present disclosure, the IMDs are formed of low-k dielectric materials. The dielectric constants (k values) of the low-k dielectric materials may be lower than about 3.0, for example. The dielectric layers may comprise a carbon-containing low-k dielectric material, Hydrogen SilsesQuioxane (HS Q), MethylSilsesQuioxane (MSQ), or the like. In accordance with some embodiments of the present disclosure, the formation of the dielectric layers includes depositing a porogen-containing dielectric material and then performing a curing process to drive out the porogen, and hence the remaining dielectric layers are porous.

A top metal layer 131 is formed over the interconnect structure 128. In accordance with some embodiments, top metal layer 131 is formed using materials and processes similar to those used in the formation of the metal lines 128c. Surface dielectric layer 130 is formed over interconnect structure 128 and the top metal layer 131. In accordance with some embodiments, surface dielectric layer 130 is formed of a polymer, which may include polybenzoxazole (PBO), polyimide, benzocyclobutene (BCB), or the like.

Bond pads 132 are formed on the top surface of device dies 122 and on the top metal layer 131. The respective process is illustrated as process 802 in the process flow 800 as shown in FIG. 23. In accordance with some embodiments, bond pads 132 are electrically and signally connected to integrated circuit devices 126 (if used), and to through-vias 125. In accordance with some embodiments, bond pads 132 are micro-bumps having lateral dimension W1 and pitch P1. The lateral dimension W1 may be between 16 μm and 30 μm and the pitch P1 may be between 19 μm and 36 μm, though other dimensions are contemplated and may be used.

Solder regions 134 may be formed on top of bond pads 132. The respective process is also illustrated as process 802 in the process flow 800 as shown in FIG. 23. The formation of bond pads 132 and solder regions 134 may include depositing a metal seed layer, forming and patterning a plating mask such as a photo resist, and plating bond pads 132 and solder regions 134 in the openings in the patterned plating mask. The metal seed layer may include a copper layer, or a titanium layer and a copper layer over the titanium layer. The plated bond pads 132 may include copper, nickel, palladium, or composite layers thereof. The patterned plating mask is then removed, followed by an etching process to remove the portions of the metal seed layer that were previously covered by the plating mask. A reflow process is then performed to reflow solder regions 134.

Further referring to FIG. 1, device dies 122 are probed, for example, by putting the pins of probe card 141 into contact with solder regions 134. The respective process is illustrated as process 804 in the process flow 800 as shown in FIG. 23. Probe card 141 is connected to a probing device (not shown), which is electrically connected to a tool (not shown) configured to determine the connection and the functionality of device dies 122. Through the probing of device dies 122, it can be determined which of device dies 122 are defective dies, and which of device dies 122 are functioning (good) dies. The solder regions 134 are softer than the underlying bond pads 132, so that the pins in the probe card 141 can have better electrical connection to the bond pads 132. In some embodiments, the solder regions 134 may be omitted. In some embodiments, the device dies 122 may be probed after singulation instead of before singulation (see FIG. 4).

Figure 2:
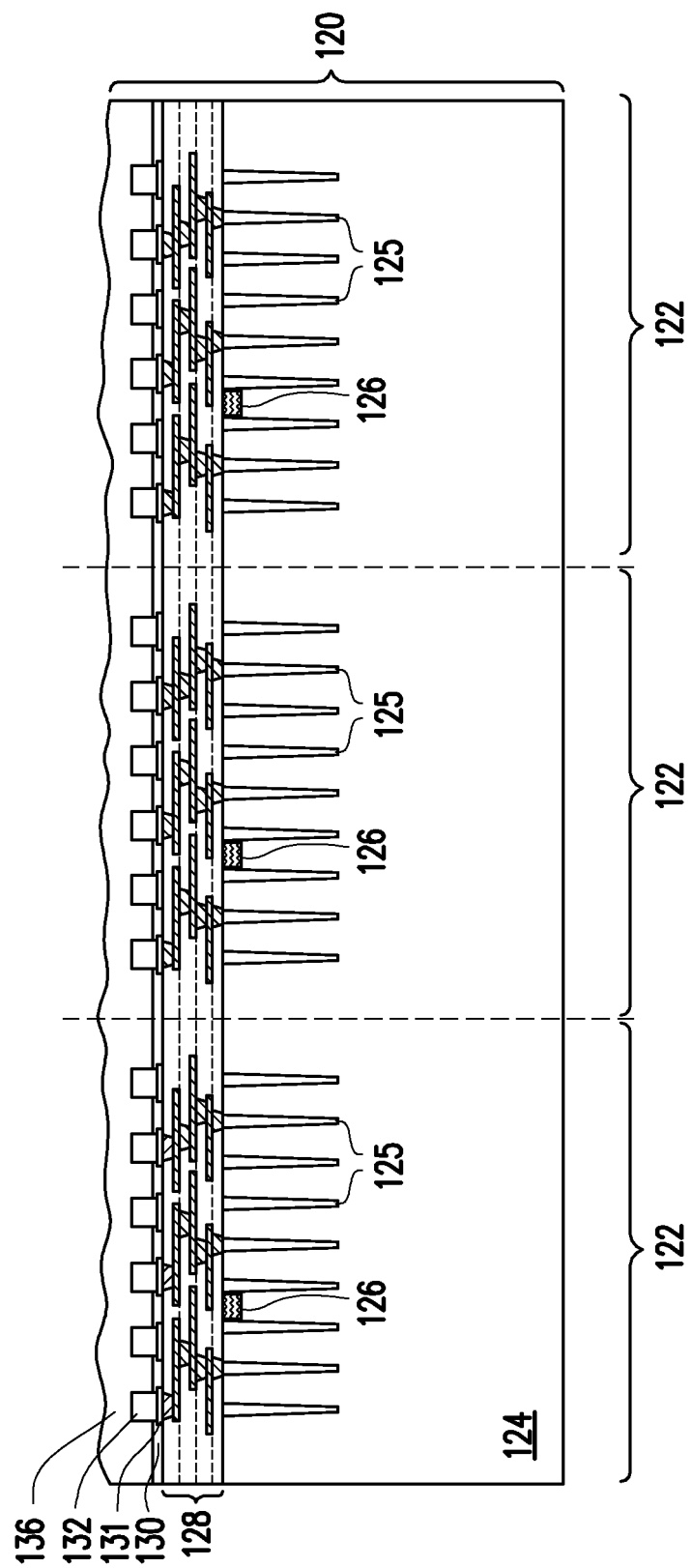

Referring to FIG. 2, after the probing process, the solder regions 134 are removed through etching in accordance with some embodiments. The respective process is illustrated as process 806 in the process flow 800 as shown in FIG. 23. In accordance with other embodiments, solder regions 134 are not etched at this time, and are left in the final package or may be removed at a later stage in the process. In the subsequent figures, solder regions 134 are not illustrated. It is appreciated, however, that solder regions 134 may still exist (or may not exist) in these figures.

A dielectric layer 136 is deposited over the bond pads 132 and fills the spaces between the bond pads 132. The respective process is illustrated as process 806 in the process flow 800 as shown in FIG. 23. The dielectric layer 136 may be deposited using any appropriate material and deposition technique. In some embodiments, the dielectric layer 136 is a polymer layer. The dielectric layer 136 may be formed by depositing a solution that comprises a solute (e.g., a polymer) dissolved in a solvent over the wafer 120, where the polymer comprises polyimide (PI), polybenzoxazole (PBO), polyacrylate, the like, or combinations thereof, and the solvent comprises N-Methyl-2-pyrrolidone (NMP), gamma-butyrolactone (GBL), ethyl lactate (EL), tetrahydrofuran (THF), dimethylformamide (DMF), the like, or combinations thereof. A suitable deposition method, such as spin coating, may be used to deposit the dielectric layer 136.

In some embodiments, after the dielectric layer 136 is deposited over the wafer 120 and over the die connectors £bond pads 132), an upper surface of the dielectric layer 136 (e.g., a solution at this stage of processing) distal to the wafer 120 is flat. Next, a curing process is performed to cure the dielectric layer 136. The curing process may be performed at a temperature between about 170° C. and about 350° C., for a duration of between about 1 hour and about 4 hours. After curing, shrinkage can cause the dielectric layer 136 to become non-flat (e.g., uneven, non-planar, non-level, curved, or wavy) surface. For example, since a thickness of a first portion of dielectric layer 136 over (e.g., directly over) the bond pads 132 is smaller than a thickness of a second portion of the dielectric layer 136 between two bond pads 132 (e.g., directly over the surface dielectric layer 130, or laterally adjacent to the bond pads 132), the first portion of the dielectric layer 136 shrinks less than the second portion of the dielectric layer 136 after the curing. As a result, after the curing process, the upper surface of the dielectric layer 136 may be wavy, alternating between concave and convex surfaces corresponding to the underlying pattern of bond pads 132.

Figure 3:
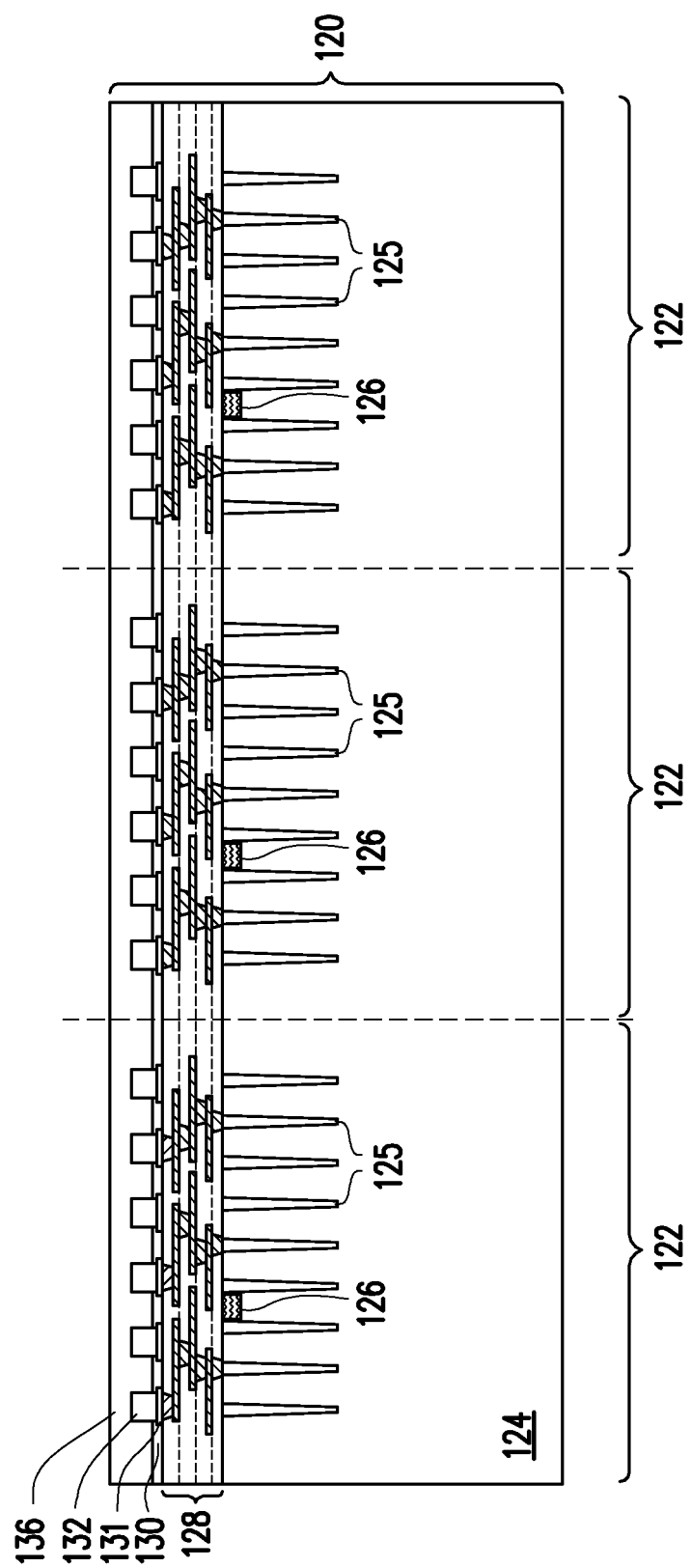

In FIG. 3, the upper surface of the dielectric layer 136 is planarized, using for example a grinding or chemical mechanical polishing (CMP) process, thereby causing the upper surface of the dielectric layer 136 to become flat. The respective process is illustrated as process 808 in the process flow 800 as shown in FIG. 23.

In semiconductor manufacturing, total thickness variation (TTV) may be used to characterize the variation of a thickness of a layer or a device. In the illustrated embodiment, the TTV of the wafer 120 (including the optional interconnect structure 128 and bond pads 132) is ultimately determined by the unevenness of the upper surface of the dielectric layer 136 as the bottom surface of the semiconductor substrate 124 of the wafer 120 is presumed be relatively flat. In the illustrated embodiment, the TTV of the dielectric layer 136 may be calculated as a deviation by the upper surface of the dielectric layer 136 from a plane disposed mid-way between a highest point of the dielectric layer 136 and a lowest point of the upper surface of the dielectric layer 136. In other words, a distance between the highest point and the lowest point of the upper surface of the dielectric layer 136 is equal to twice the value of the TTV of the wafer 120, in some embodiments. Following the planarization process of the dielectric layer 136, the TTV of the wafer 120 is less than 3 μm, for example, a non-zero value between 0.3 μm and 3 μm.

Figure 4:
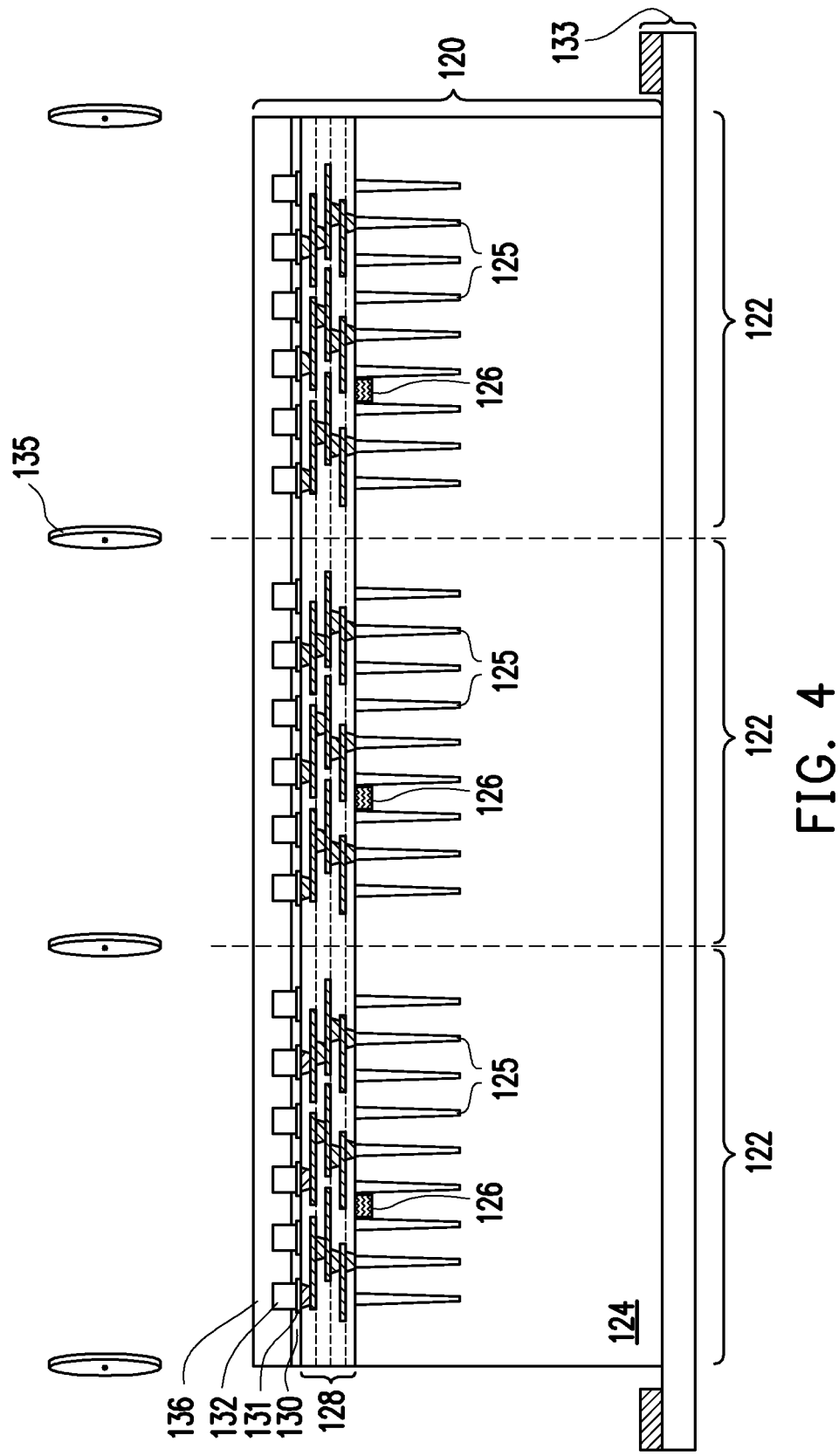

In FIG. 4, the wafer 120 is attached to a frame 133 and a singulation process 135 is then performed using, for example, a die-sawing process, a laser cutting process, or the like, so that the wafer 120 is separated into dies 122. The respective process is illustrated as process 810 in the process flow 800 as shown in FIG. 23. In some embodiments, the dies 122 may be considered to be device dies due to the embedded devices 126, while in other embodiments, the dies 122 may not have active devices, but may have passive devices or may be an interposer. The known good dies (KGDs) 122 which are singulated from the wafer 120 may be used in subsequent processes. If the dies 122 have not been tested, they may be tested, for example, using processes similar to those discussed above with respect to FIG. 1. The dies 122 which did not pass the testing process may be discarded or recycled. Costs can be reduced by eliminating the failed dies 122.

Figure 5:
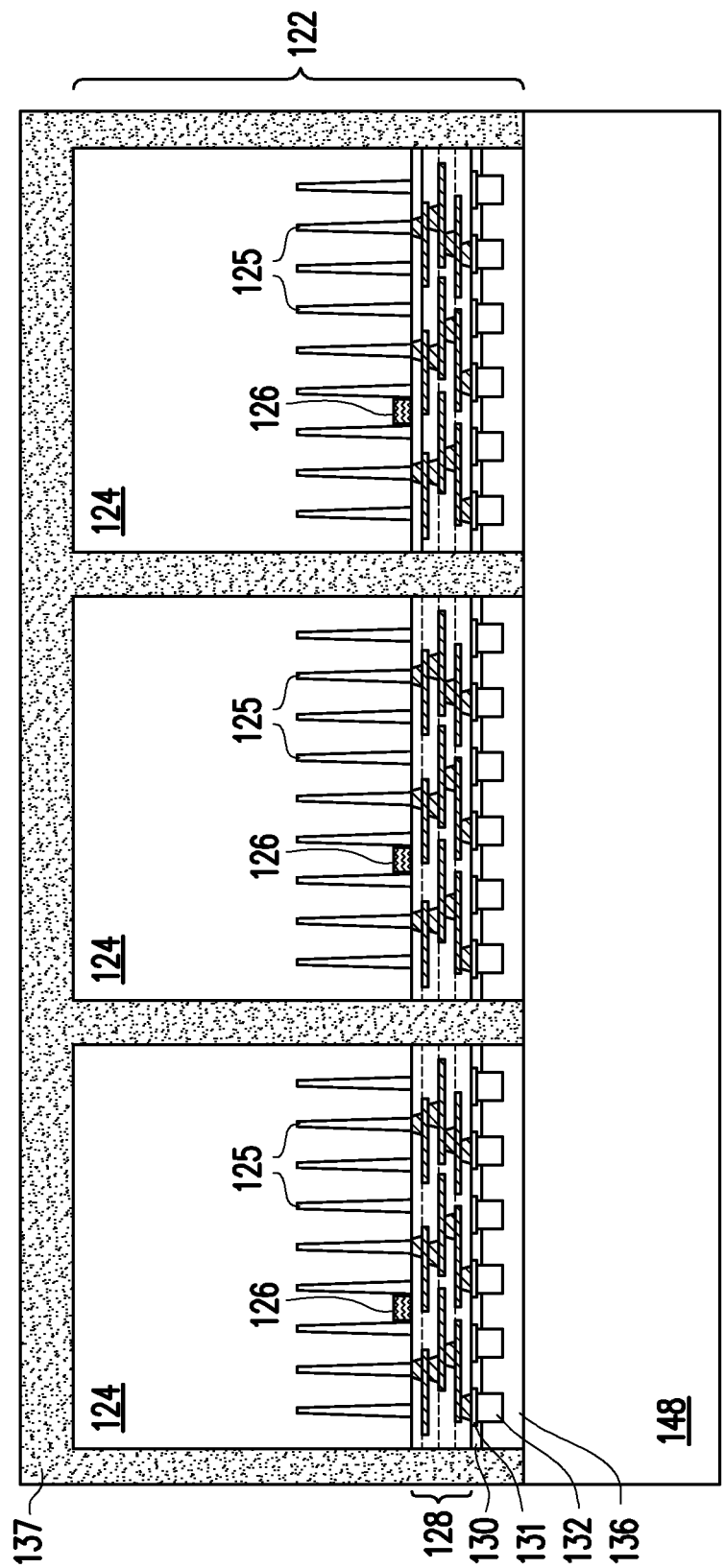

In FIG. 5, the KGDs 122 may be flipped and mounted to a carrier substrate 148. The respective process is illustrated as process 812 in the process flow 800 as shown in FIG. 23. The back side of the dies 122 therefore becomes the front side of the dies 122 and is referred to as such hereafter. The carrier substrate 148 may be a glass carrier substrate, a ceramic carrier substrate, or the like. The carrier substrate 148 may be a wafer, such that multiple packages can be formed on the carrier substrate 148 simultaneously.

A release layer (not shown) may be used between each of the dies 122 and the carrier substrate 148. The release layer may be formed of a polymer-based material, which may be removed along with the carrier substrate 148 in subsequent steps. In some embodiments, the dielectric layer 136 may be utilized as the release layer. In some embodiments, the release layer is an epoxy-based thermal-release material, which loses its adhesive property when heated, such as a light-to-heat-conversion (LTHC) release coating. In other embodiments, the release layer may be an ultra-violet (UV) glue, which loses its adhesive property when exposed to UV lights. The release layer may be dispensed as a liquid and cured, may be a laminate film laminated onto the carrier substrate 148, or may be the like. The top surface of the release layer may be leveled and may have a high degree of planarity.

Also in FIG. 5, an encapsulant 137 is deposited over and between the dies 122, encapsulating the dies 122 therein. The respective process is illustrated as process 814 in the process flow 800 as shown in FIG. 23. The encapsulant 137 fills the gaps between neighboring dies 122. The encapsulant 137 may be or may comprise a molding compound, a molding underfill, an epoxy, and/or a resin, and may be deposited using any suitable process. After the encapsulation, the top surface of encapsulant 137 is higher than the top surfaces of dies 122. Encapsulant 137 may include one layer or multiple layers.

Figure 6:
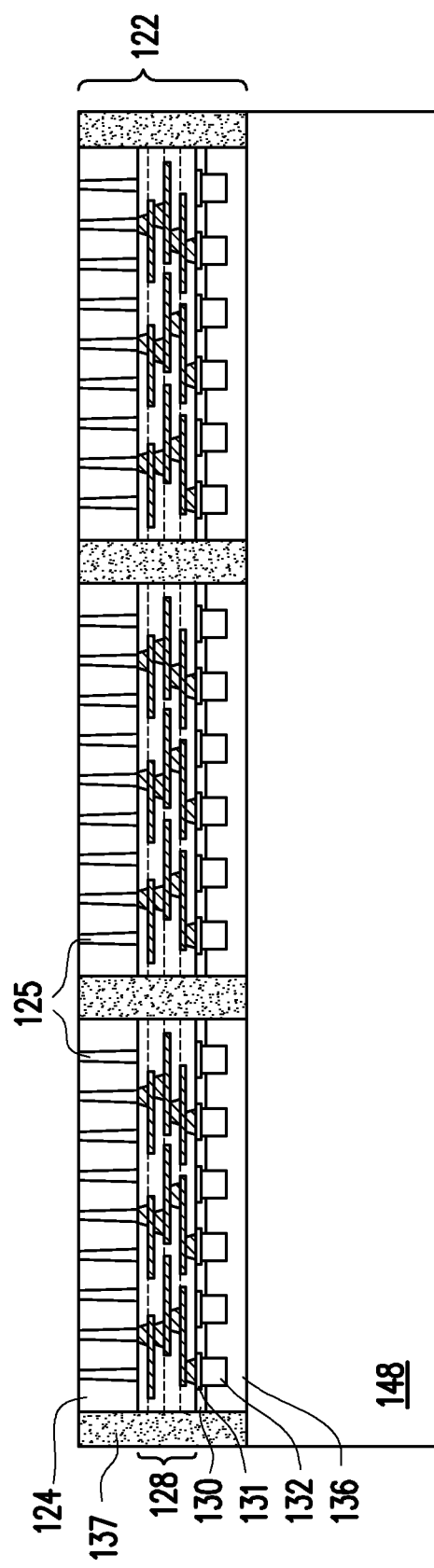

Next, in FIG. 6, a thinning process is performed to the front sides of the dies 122. The respective process is illustrated as process 816 in the process flow 800 as shown in FIG. 23. The thinning process may be performed utilizing a grinding process that removes portions of the semiconductor substrate 124 of the dies 122 to expose the through-vias 125. The encapsulant 137 over the dies 122 is also removed and the encapsulant 137 laterally surrounding the dies 122 is levelled with the substrate 124. By performing the through-via 125 protrusion first (before attaching a device die), the total thickness variation (TTV) of the dies 122 is reduced. Each structure added over the semiconductor substrate 124 will cause the TTV of the dies 122 to become further from zero because deposition rates and etching rates are different across the surfaces of the dies 122. Generally, planarization processes may be utilized to flatten an upper surface of a structure, however the wider the surface, such as across the entire carrier substrate 148, the greater the height variation resulting from planarization.

In advanced technology nodes, the through-vias 125 after thinning are shortened, being less than 15 µm, such as between about 3 µm and about 10 µm. By performing the through-via 125 protrusion early in the process (before any dies are attached to the dies 122), the TTV is reduced because thickness variation which would be introduced by the attaching of device dies is avoided. Having a reduced TTV is advantageous because the thinning process otherwise may cause failures in the shortened through-vias 125.

Due to the flipping of the dies 122, the through-vias 125 may be tapered from a narrower first width to a wider second width, top to bottom.

Figure 7:
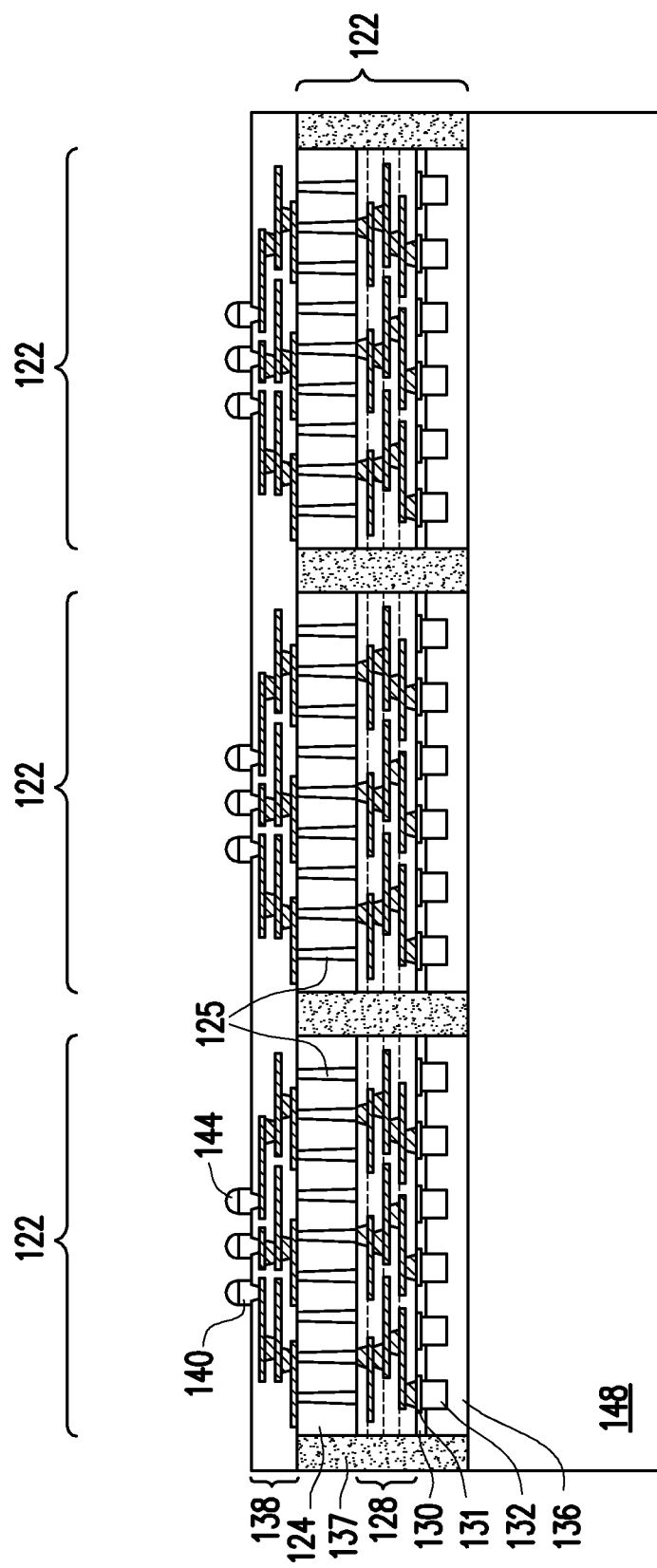

In FIG. 7, after the thinning process, an optional interconnect structure 138 may be formed over the through-vias 125. The respective process is illustrated as process 818 in the process flow 800 as shown in FIG. 23. The interconnect structure 138 may be formed using processes and materials similar to the formation of the interconnect structure 128. Under bump metallizations (UBMs) 140 are formed for external connection to the front-side interconnect structure 138. The UBMs 140 have bump portions on and extending along the major surface of the uppermost dielectric layer of the interconnect structure 138, and have via portions extending through the uppermost dielectric layer of the interconnect structure 138 to physically and electrically couple the metal layers of the interconnect structure 138. As a result, the UBMs 140 are electrically coupled to the through-vias 125. The UBMs 140 may be formed of the same material and using processes similar to those as the metal lines of the interconnect structure 138.

Conductive connectors 144 may next be formed on the UBMs 140. The respective process is also illustrated as process 818 in the process flow 800 as shown in FIG. 23. The conductive connectors 144 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 144 may include a conductive material such as solder, copper, aluminum, gold, nickel, silver, palladium, tin, the like, or a combination thereof. In some embodiments, the conductive connectors 144 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 144 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In a subsequent process, one or more device dies may be attached to the conductive connectors 144.

Figure 8:
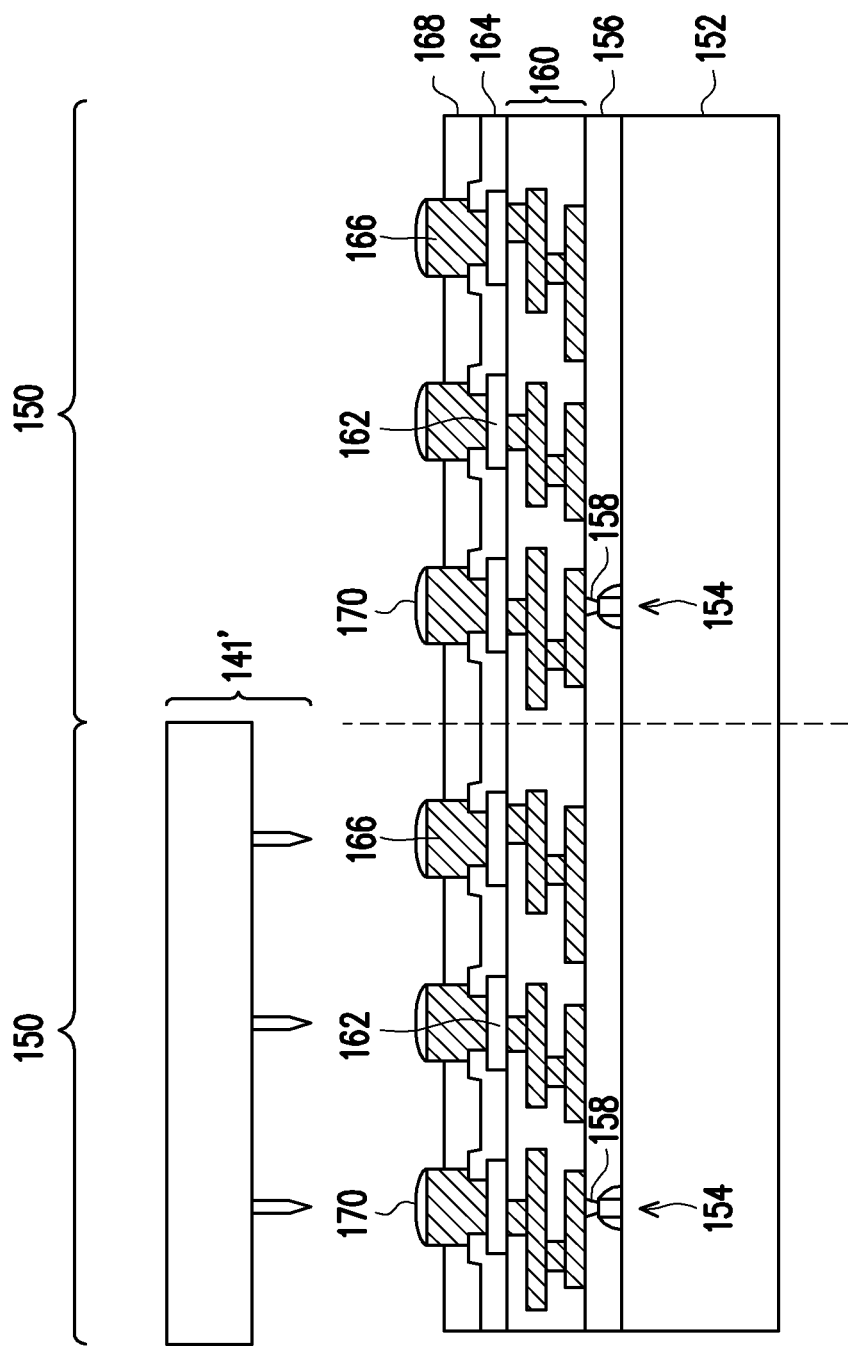

FIG. 8 illustrates a cross-sectional view of integrated circuit dies 150 in a wafer in accordance with some embodiments. The integrated circuit dies 150 will be packaged in subsequent processing to form an integrated circuit package or chiplet. The integrated circuit die 150 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. The integrated circuit dies 150 may be formed using techniques in the same technology node or a different technology node as that used to form the device dies 122.

The integrated circuit dies 150 may be formed in a wafer, which may include different device regions that are singulated in subsequent steps to form a plurality of integrated circuit dies. The integrated circuit dies 150 may be processed according to applicable manufacturing processes to form integrated circuits. For example, the integrated circuit dies 150 include a semiconductor substrate 152, such as silicon, doped or undoped, or an active layer of a semiconductor-on-insulator (SOI) substrate. The semiconductor substrate 152 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 152 has an active surface (e.g., the surface facing upwards in FIG. 8), sometimes called a front side, and an inactive surface (e.g., the surface facing downwards in FIG. 8), sometimes called a back side.

Devices (represented by a transistor) 154 may be formed at the front surface of the semiconductor substrate 152. The devices 154 may be active devices (e.g., transistors, diodes, etc.), capacitors, resistors, etc. An inter-layer dielectric (ILD) 156 is over the front surface of the semiconductor substrate 152. The ILD 156 surrounds and may cover the devices 154. The ILD 156 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 158 extend through the ILD 156 to electrically and physically couple the devices 154. For example, when the devices 154 are transistors, the conductive plugs 158 may couple the gates and source/drain regions of the transistors. The conductive plugs 158 may be formed of tungsten, cobalt, nickel, copper, silver, gold, aluminum, the like, or combinations thereof. An interconnect structure 160 is over the ILD 156 and conductive plugs 158. The interconnect structure 160 interconnects the devices 154 to form an integrated circuit. The interconnect structure 160 may be formed by, for example, metallization patterns in dielectric layers on the ILD 156. The metallization patterns include metal lines and vias formed in one or more low-k dielectric layers, formed in a process and using materials similar to those discussed above with respect to the interconnect structure 128. The metallization patterns of the interconnect structure 160 are electrically coupled to the devices 154 by the conductive plugs 158.

The integrated circuit dies 150 further include pads 162, such as aluminum pads, to which external connections are made. The pads 162 are on the active side of the integrated circuit die 150, such as in and/or on the interconnect structure 160. One or more passivation films 164 are on the integrated circuit die 150, such as on portions of the interconnect structure 160 and pads 162. Openings extend through the passivation films 164 to the pads 162. Die connectors 166, such as conductive pillars (for example, formed of a metal such as copper), extend through the openings in the passivation films 164 and are physically and electrically coupled to respective ones of the pads 162. The die connectors 166 may be formed by, for example, plating, or the like. The die connectors 166 electrically couple the respective integrated circuits of the integrated circuit die 150.

Conductive connectors 170 are formed at the surface of integrated circuit dies 150. The formation process and the materials of conductive connectors 170 may be similar to that of the conductive connectors 144 (FIG. 7). Integrated circuit dies 150 are probed, for example, using probe card 141', so that defective integrated circuit dies 150 are found, and known-good-dies (KGDs) are determined. The probing is performed on each of integrated circuit dies 150. The respective process is illustrated as process 820 in the process flow 800 as shown in FIG. 23.

A dielectric layer 168 may (or may not) be on the active side of the integrated circuit dies 150, such as on the passivation films 164 and the die connectors 166. The dielectric layer 168 laterally encapsulates the die connectors 166, and the dielectric layer 168 is laterally coterminous with the integrated circuit dies 150. Initially, the dielectric layer 168 may bury the die connectors 166, such that the topmost surface of the dielectric layer 168 is above the topmost surfaces of the die connectors 166. In some embodiments where solder regions are disposed on the die connectors 166, the dielectric layer 168 may bury the solder regions as well. Alternatively, the solder regions may be removed prior to forming the dielectric layer 168.

The dielectric layer 168 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 168 may be formed, for example, by spin coating, lamination, chemical vapor deposition (CVD), or the like. In some embodiments, the die connectors 166 are exposed through the dielectric layer 168 during formation of the integrated circuit dies 150. In some embodiments, the die connectors 166 remain buried and are exposed during a subsequent process for packaging the integrated circuit die 150. Exposing the die connectors 166 may remove any solder regions that may be present on the die connectors 166.

Following the formation of the layers, devices, and connectors of the integrated circuit dies 150, the integrated circuit dies 150 may be singulated from one another using a dicing blade, a laser cutting tool, or the like, thereby forming a plurality of individual integrated circuit dies 150. KGDs may be separated and used in subsequent processes, while dies which have failed testing may be discarded.

In some embodiments, the integrated circuit die 150 is a stacked device that includes multiple semiconductor substrates 152. For example, the integrated circuit die 150 may be a memory device such as a hybrid memory cube (HMC) module, a high bandwidth memory (HBM) module, or the like that includes multiple memory dies. In such embodiments, the integrated circuit die 150 includes multiple semiconductor substrates 152 interconnected by through-substrate vias (TSVs). Each of the semiconductor substrates 152 may (or may not) have an interconnect structure 160.

Figure 9:
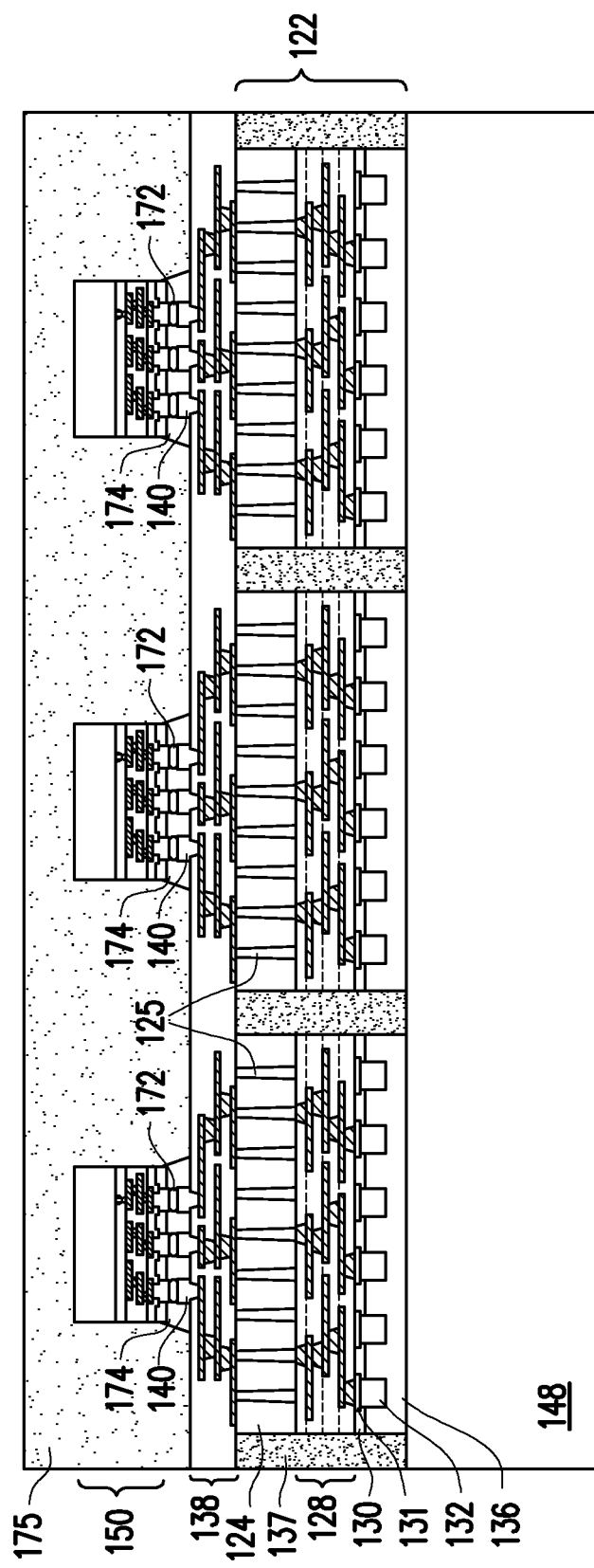

In FIG. 9, the integrated circuit dies 150 which are KGDs are bonded to the KGDs 122 attached to the carrier substrate 148. The respective process is illustrated as process 820 in the process flow 800 as shown in FIG. 23. In some embodiments, the bonding process includes applying a flux onto conductive connectors 144, placing integrated circuit dies 150 onto dies 122, and performing a reflow process, so that conductive connectors 144 and 170 are molten to form solder regions 172. After the reflow process, an underfill 174 may optionally be dispensed into the gaps between integrated circuit dies 150 and the respective underlying device dies 122, and then cured.

Next, an encapsulant 175 may be deposited to laterally encapsulate the integrated circuit dies 150 and may cover the upper surface of each of the integrated circuit dies 150. The respective process is illustrated as process 824 in the process flow 800 as shown in FIG. 23. Encapsulant 175 fills the gaps between neighboring integrated circuit dies 150. Encapsulant 175 may be or may comprise a molding compound, a molding underfill, an epoxy, and/or a resin, and may be deposited using any suitable process. After the encapsulation, the top surface of encapsulant 175 is higher than the top surfaces of integrated circuit dies 150. Encapsulant 175 may include one layer or multiple layers.

Figure 10:
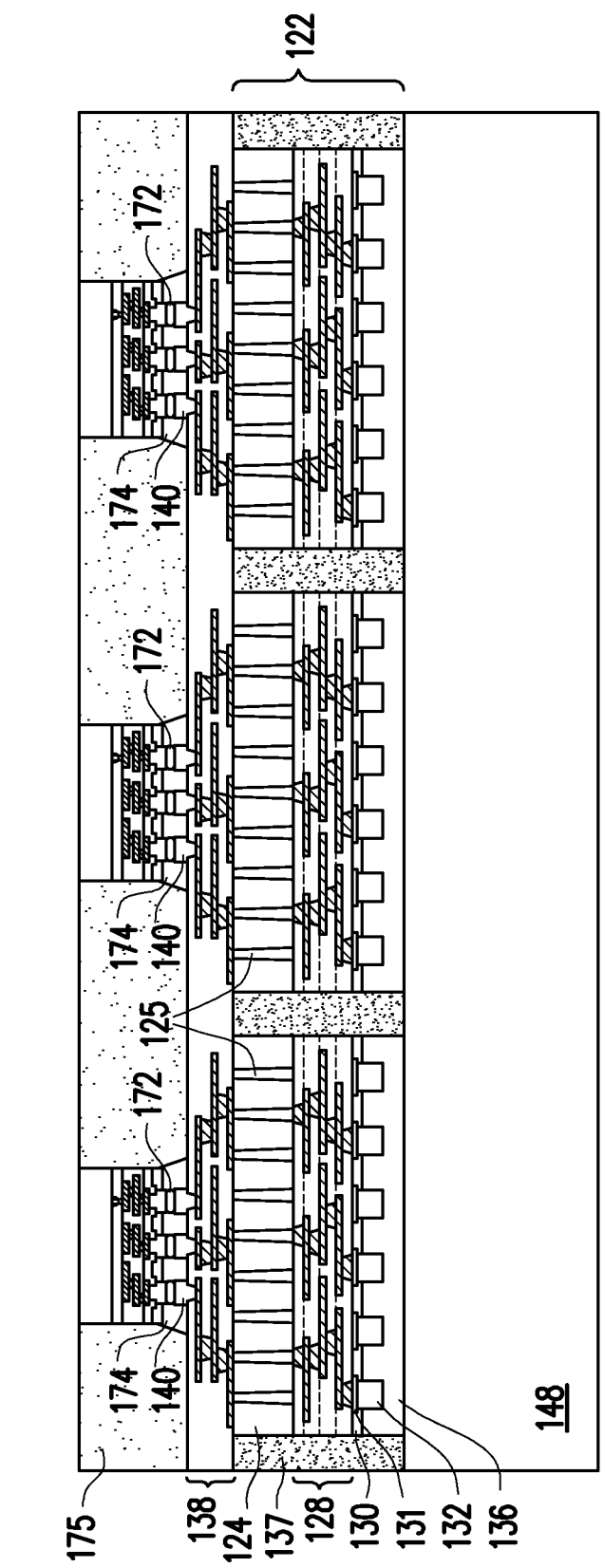

In FIG. 10, after the encapsulating process, a planarization process is performed to reduce the thickness of, and to level the top surface of, encapsulant 175. The respective process is also illustrated as process 824 in the process flow 800 as shown in FIG. 23. The thickness of the semiconductor substrate 152 (FIG. 98) of the integrated circuit dies 150 may also be thinned. Following the planarization process, the upper surface of the integrated circuit dies 150 may be level with the upper surface of the encapsulant 175. Because the thickness of the TSVs 125 have already been reduced, the tolerance for error in the planarity of the upper surface of the encapsulant 175 is greater than would be if the through-vias 125 are still in need of thinning. For example, the TTV of the encapsulant 175 may be greater than 300 nm.

Figure 11:
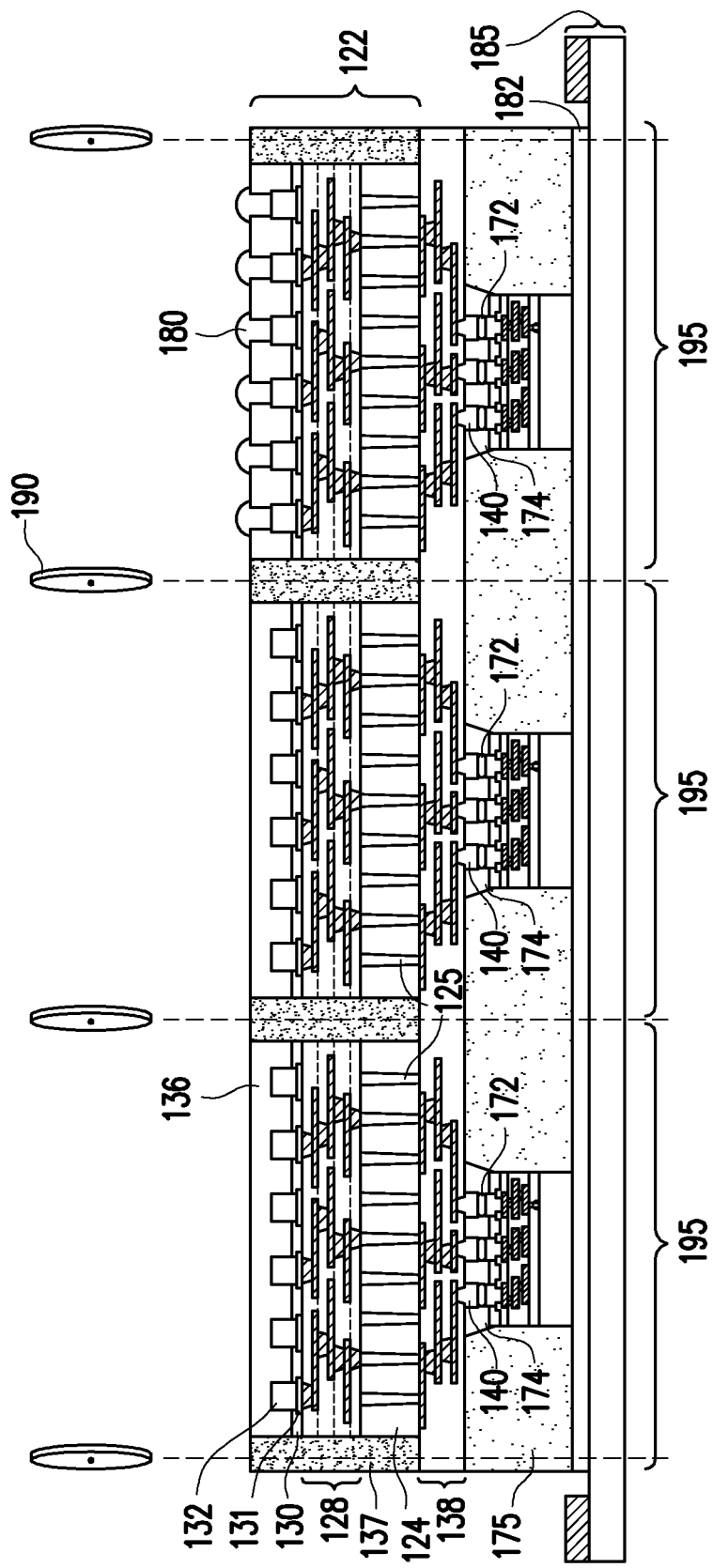

In FIG. 11, the workpiece having dies 122 with embedded integrated circuit dies 150 is flipped and attached to frame 185 through die attach film (DAF) 182, which is an adhesive film. The carrier substrate 148 is removed, for example, by projecting a light beam (such as laser beam) on the release film, the light penetrating through the transparent carrier substrate 148. The respective process is illustrated as process 826 in the process flow 800 as shown in FIG. 23. The release film is thus decomposed, and the dies 122 are released from carrier substrate 148. As illustrated in FIG. 11 (e.g. the right hand die 122), in some embodiments, openings may be formed in the dielectric layer 136, thereby exposing the bond pads 132. Thereafter, connectors 180 may be formed in the openings. Connectors 180 may be formed using materials and processes similar to those discussed above with respect to conductive connectors 144 (FIG. 7). In other embodiments, openings and/or connectors 180 may not be formed.

A singulation process 190 is then performed, such as by a die sawing process, laser cutting process, or the like, so that the combined device dies 122 and integrated circuit dies 150 are separated into packages 195. The respective process is illustrated as process 828 in the process flow 800 as shown in FIG. 23. Packages 195 can have different portions formed using different technology nodes. For example, the device dies 122 may be formed using patterning and processing techniques from different technology generations (e.g., technology nodes N5, N7, etc.). These different generational patterning and processing techniques are generally referred to as a technology node. As a result the pattern and device density of the device dies 122 may differ. Similarly, integrated circuit dies 150 may also be formed using patterning and processing techniques from different technology nodes. Packages 195 may also have different portions formed using the same technology node processes. The DAF 182 is removed in a cleaning process, removing the packages 195 from the frame 185. The resulting structure is shown in FIGS. 12A and 12B. The packages 195 have encapsulant 137 on sidewalls laterally surrounding the dies 122 and the encapsulant 175 on sidewalls laterally surrounding the integrated circuit dies 150. The interconnect 138 has sidewalls of the dielectric material in the interconnect 138.

In FIGS. 12A and 12B, the package 195A is illustrated in accordance with some embodiments. FIG. 12A is a cross-sectional view of the package 195A along the line A-A of FIG. 12B. FIG. 12B is a top down view of the package 195A. As noted in FIGS. 12A and 12B, the package 195A may include one integrated circuit die 150 and one die 122 to form a chiplet. In some embodiments, the integrated circuit die 150 may be within the lateral extents of the die 122, while in other embodiments one or more edges of the integrated circuit die 150 may overlap an edge of the die 122.

Figures 13A, 13B:
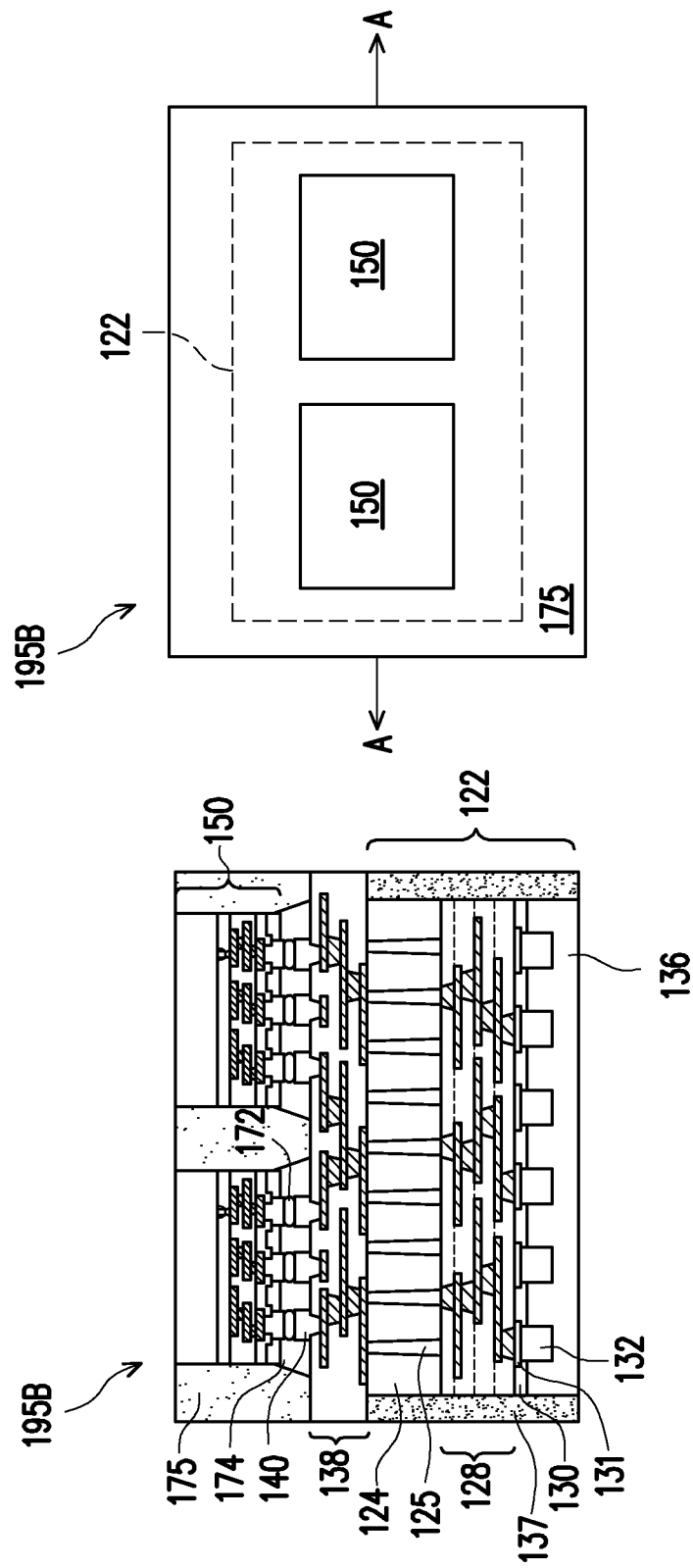

In FIGS. 13A and 13B, the package 195B is illustrated in accordance with some embodiments. FIG. 13A is a cross-sectional view of the package 195B along the line A-A of FIG. 13B. FIG. 13B is a top down view of the package 195B of FIG. 13A. As illustrated in FIGS. 13A and 13B, the package 195B is similar to the package 195A of FIGS. 12A and 12B, but may include one die 122 and two or more integrated circuit dies 150 to form a chiplet. The two integrated circuit dies 150 may have the same function or different functions and the die 122 may serve to connect contacts in one integrated circuit die 150 to the other integrated circuit die 150. In some embodiments, the integrated circuit dies 150 may be within the lateral extents of the die 122, while in other embodiments one or more edges of the integrated circuit dies 150 may overlap one or more edges of the die 122, such as illustrated in FIGS. 14A and 14B.

Figures 14A, 14B:
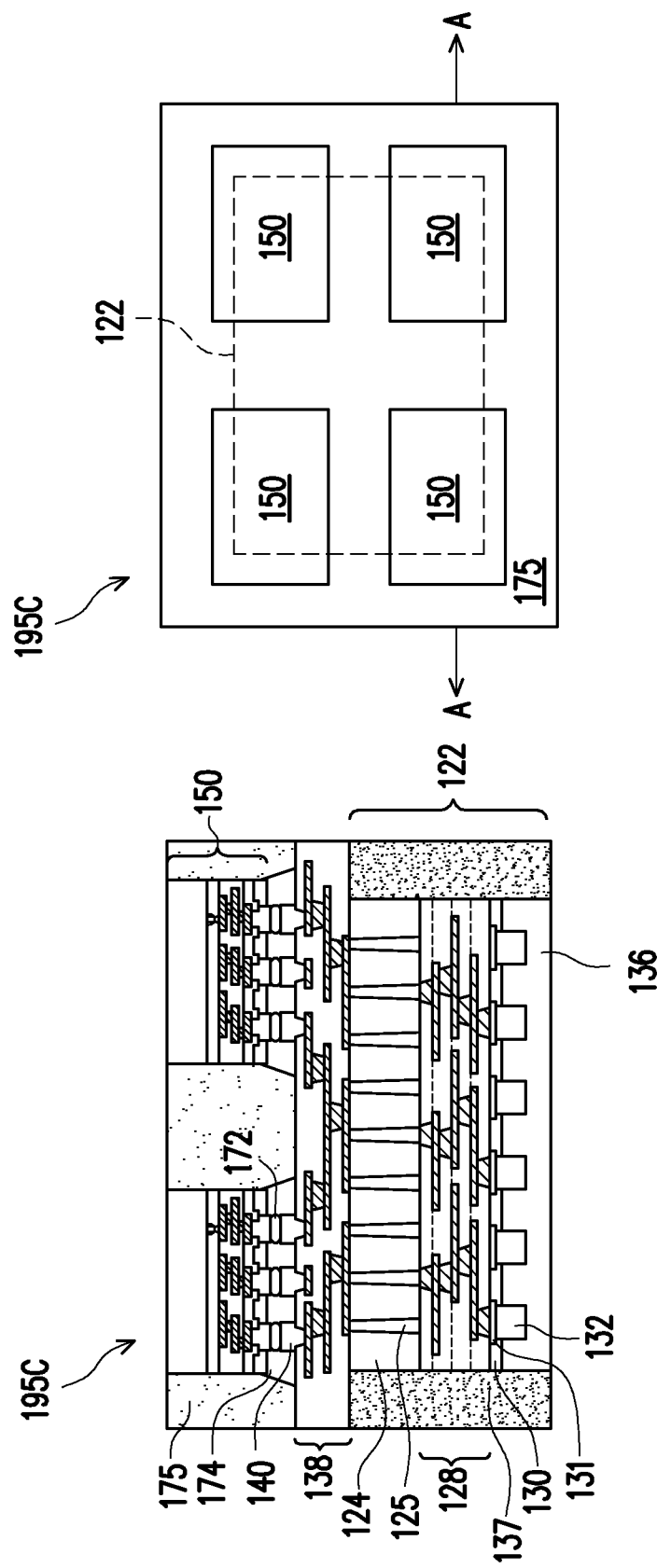

In FIGS. 14A and 14B, the package 195C is illustrated in accordance with some embodiments. FIG. 14A is a cross-sectional view of the package 195C along the line A-A of FIG. 14B. FIG. 14B is a top down view of the package 195C of FIG. 14A. As illustrated in FIGS. 14A and 14B, the package 195C is similar to the package 195A of FIGS. 12A and 12B, but may include one die 122 and multiples of the integrated circuit dies 150 (in the illustrated embodiment, four) to form a chiplet. The various integrated circuit dies 150 may have the same functions or different functions or combinations thereof. The die 122 may serve to connect contacts in one integrated circuit die 150 to the other integrated circuit die 150. In some embodiments, the integrated circuit dies 150 may be within the lateral extents of the die 122, while in other embodiments one or more edges of the integrated circuit dies 150 may overlap an edge of the die 122, such as illustrated.

In FIGS. 15A, 15B, and 15C, the package 195D is illustrated in accordance with some embodiments. FIG. 15A is a cross-sectional view of the package 195D along the line A-A of FIG. 15B. FIG. 15B is a top down view of the package 195D of FIG. 15A. FIG. 15C is a cross-sectional view of the package 195D along the line B-B of FIG. 15B. As illustrated in FIGS. 15A, 15B, and 15C, the package 195D is similar to the package 195A of FIGS. 12A and 12B, but may include multiple dies 122 and one integrated circuit die 150 to form a chiplet. The various dies 122 may be different or may be the same. In some embodiments, the integrated circuit die 150 may be within the lateral extents of one of the dies 122, the dies 122 may be within the lateral extents of the integrated circuit dies 150, or one or more edges of the integrated circuit die 150 may overlap one or more edges of the dies 122, such as illustrated in FIG. 15B.

In FIGS. 16A, 16B, and 16C, the package 195E is illustrated in accordance with some embodiments. FIG. 16A is a cross-sectional view of the package 195E along the line A-A of FIG. 16B. FIG. 16B is a top down view of the package 195E of FIG. 16A. FIG. 16C is a cross-sectional view of the package 195E along the line B-B of FIG. 16B. As illustrated in FIGS. 16A, 16B, and 16C, the package 195E is similar to the package 195A of FIGS. 12A and 12B, but may include multiple dies 122 and multiple integrated circuit dies 150 to form a chiplet. The various integrated circuit dies 150 and various dies 122 may be different or may be the same. In some embodiments, each of the integrated circuit dies 150 may be within the lateral extents of one of the dies 122, each of the dies 122 may be within the lateral extents of the integrated circuit dies 150, or one or more edges of the integrated circuit dies 150 may overlap one or more edges of the dies 122, such as illustrated in FIG. 16B.

Figure 24:
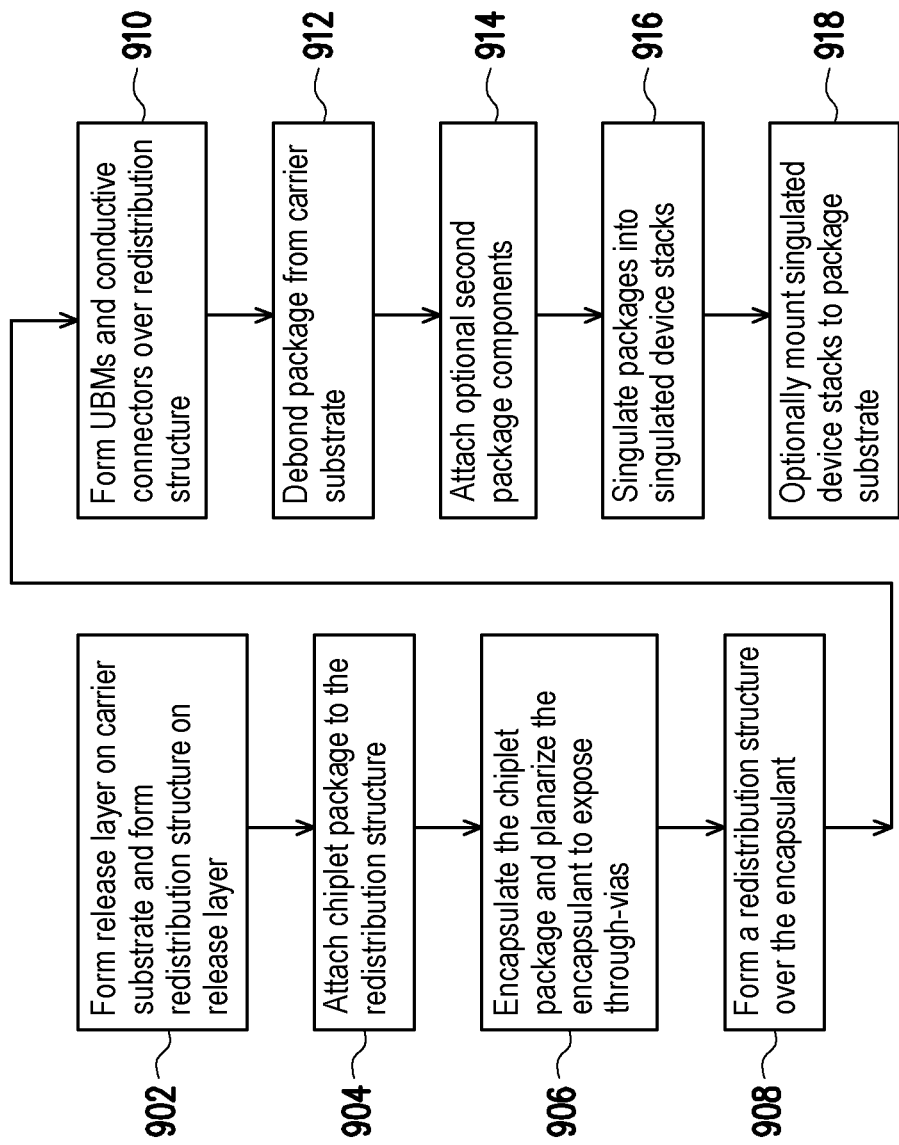
FIG. 24 illustrates a process flow for forming an integrated fan out package including a chiplet die stack, in accordance with some embodiments.

FIGS. 17 through 20 illustrate intermediate stages of the formation of an integrated fan-out (InFO) package using the package 195 (under any of the previously discussed configurations in the package 195A, the package 195B, the package 195C, the package 195D, or the package 195E) as a chiplet device die of the InFO package. For simplicity, any variation of these packages will simply be referred to as the package 195. The corresponding processes are reflected schematically in the process flow 900 as shown in FIG. 24.

Figure 17:
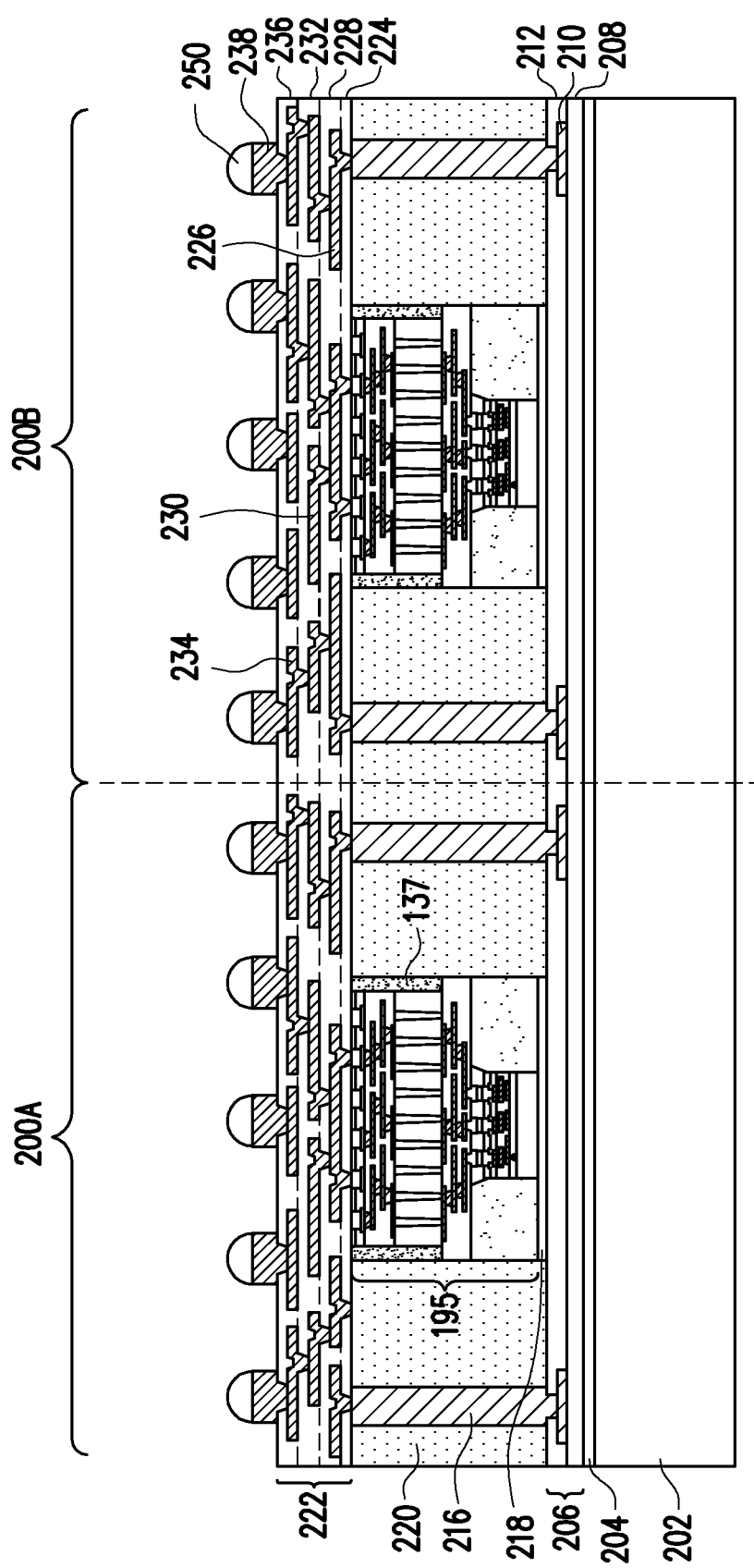
FIGS. 17 through 20 illustrate cross-sectional views of intermediate stages in the formation of an integrated fan out package, in accordance with some embodiments.

In FIG. 17, a carrier substrate 202 is provided, and a release layer 204 is formed on the carrier substrate 202. The respective process is illustrated as process 902 in the process flow 900 as shown in FIG. 24. The carrier substrate 202 may be a glass carrier substrate, a ceramic carrier substrate, or the like. The carrier substrate 202 may be a wafer, such that multiple packages can be formed on the carrier substrate 202 simultaneously.

The release layer 204 may be formed of a polymer-based material, which may be removed along with the carrier substrate 202 from the overlying structures that will be formed in subsequent steps. In some embodiments, the release layer 204 is an epoxy-based thermal-release material, which loses its adhesive property when heated, such as a light-to-heat-conversion (LTHC) release coating. In other embodiments, the release layer 204 may be an ultra-violet (UV) glue, which loses its adhesive property when exposed to UV lights. The release layer 204 may be dispensed as a liquid and cured, may be a laminate film laminated onto the carrier substrate 202, or may be the like. The top surface of the release layer 204 may be leveled and may have a high degree of planarity.

In FIG. 17, a back-side redistribution structure 206 may be formed on the release layer 204. The respective process is also illustrated as process 902 in the process flow 900 as shown in FIG. 24. In the embodiment shown, the back-side redistribution structure 206 includes a dielectric layer 208, a metallization pattern 210 (sometimes referred to as redistribution layers or redistribution lines), and a dielectric layer 212. The back-side redistribution structure 206 is optional. In some embodiments, a dielectric layer without metallization patterns is formed on the release layer 204 in lieu of the back-side redistribution structure 206.

The dielectric layer 208 may be formed on the release layer 204. The bottom surface of the dielectric layer 208 may be in contact with the top surface of the release layer 204. In some embodiments, the dielectric layer 208 is formed of a polymer, such as polybenzoxazole (PBO), polyimide, benzocyclobutene (BCB), or the like. In other embodiments, the dielectric layer 208 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 208 may be formed by any acceptable deposition process, such as spin coating, CVD, laminating, the like, or a combination thereof.

The metallization pattern 210 may be formed on the dielectric layer 208. As an example to form metallization pattern 210, a seed layer is formed over the dielectric layer 208. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist (not shown) is then formed and patterned on the seed layer. The photoresist may be formed by spin coating or the like and may be exposed to light for patterning. The pattern of the photoresist corresponds to the metallization pattern 210. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 210.

The dielectric layer 212 may be formed on the metallization pattern 210 and the dielectric layer 208. In some embodiments, the dielectric layer 212 is formed of a polymer, which may be a photo-sensitive material such as PBO, polyimide, BCB, or the like, that may be patterned using a lithography mask. In other embodiments, the dielectric layer 212 is formed of a nitride such as silicon nitride; an oxide such as silicon oxide, PSG, BSG, BPSG; or the like. The dielectric layer 212 may be formed by spin coating, lamination, CVD, the like, or a combination thereof. The dielectric layer 212 is then patterned to form openings exposing portions of the metallization pattern 210. The patterning may be formed by an acceptable process, such as by exposing the dielectric layer 212 to light when the dielectric layer 212 is a photo-sensitive material or by etching using, for example, an anisotropic etch. If the dielectric layer 212 is a photo-sensitive material, the dielectric layer 212 can be developed after the exposure.

In some embodiments, the back-side redistribution structure 206 may include any number of dielectric layers and metallization patterns. If more dielectric layers and metallization patterns are to be formed, steps and processes discussed above may be repeated. The metallization patterns may include one or more conductive elements. The conductive elements may be formed during the formation of the metallization pattern by forming the seed layer and conductive material of the metallization pattern over a surface of the underlying dielectric layer and in the opening of the underlying dielectric layer, thereby interconnecting and electrically coupling various conductive lines.

Through vias 216 are formed in the openings in the back-side redistribution structure 206 and extend away from the topmost dielectric layer of the back-side redistribution structure 206 (e.g., the dielectric layer 212). As an example to form the through vias 216, a seed layer (not shown) is formed over the back-side redistribution structure 206, e.g., on the dielectric layer 212 and portions of the metallization pattern 210 exposed by the openings. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 216.

Chiplet packages 195 are adhered to the dielectric layer 212 by an adhesive 218. The respective process is illustrated as process 904 in the process flow 900 as shown in FIG. 24. The adhesive 218 is on back-sides of the packages 195 and adheres the packages 195 to the back-side redistribution structure 206, such as to the dielectric layer 212. The adhesive 218 may be any suitable adhesive, epoxy, die attach film (DAF), or the like. The adhesive 218 may be applied to back-sides of the packages 195, may be applied over the surface of the carrier substrate 202 if no back-side redistribution structure 206 is utilized, or may be applied to an upper surface of the back-side redistribution structure 206 if applicable. For example, the adhesive 218 may be applied to the back-sides of the packages 195 before singulating the dies 122 to separate the packages 195 (see FIG. 11). Although one of the packages 195 is illustrated for each package component 200 (e.g., in a package region corresponding to package component 200A), it should be understood that multiples of the packages 195 may be used in any combination (see, e.g., FIG. 20).

Next, an encapsulant 220 is formed on and around the various components. The respective process is illustrated as process 906 in the process flow 900 as shown in FIG. 24. After formation, the encapsulant 220 encapsulates the through vias 216 and packages 195. The encapsulant 220 may be a molding compound, epoxy, or the like. The encapsulant 220 may be applied by compression molding, transfer molding, or the like, and may be formed over the carrier substrate 202 such that the through vias 216 and/or the packages 195 are buried or covered. The encapsulant 220 is further formed in gap regions between the packages 195. The encapsulant 220 may be applied in liquid or semi-liquid form and then subsequently cured. The encapsulant 220 laterally surrounds the packages 195 and has lateral extents which are greater than the lateral extents of the various features of the packages 195.

A planarization process is then performed on the encapsulant 220 to expose the through vias 216 and the bond pads 132 (see, e.g., FIG. 12A). The respective process is also illustrated as process 906 in the process flow 900 as shown in FIG. 24. The planarization process may also remove material of the through vias 216, dielectric layer 136, and/or bond pads 132 until the bond pads 132 and through vias 216 are exposed. Top surfaces of the through vias 216, bond pads 132, dielectric layer 136, and encapsulant 220 are substantially coplanar after the planarization process within process variations. The planarization process may be, for example, a chemical-mechanical polish (CMP), a grinding process, or the like. In some embodiments, the planarization may be omitted, for example, if the through vias 216 and/or bond pads 132 are already exposed.

Next, a front-side redistribution structure 222 is formed over the encapsulant 220, through vias 216, and packages 195. The respective process is illustrated as process 908 in the process flow 900 as shown in FIG. 24. The front-side redistribution structure 222 includes dielectric layers 224, 228, 232, and 236; and metallization patterns 226, 230, and 234. The metallization patterns may also be referred to as redistribution layers or redistribution lines. The front-side redistribution structure 222 is shown as an example having three layers of metallization patterns. More or fewer dielectric layers and metallization patterns may be formed in the front-side redistribution structure 222. The front-side redistribution structure 222 may be formed using processes and materials similar to those discussed above with respect to the back-side redistribution structure 206. If fewer dielectric layers and metallization patterns are to be formed, steps and process discussed above may be omitted or repeated.

UBMs 238 are formed for external connection to the front-side redistribution structure 222. The respective process is illustrated as process 910 in the process flow 900 as shown in FIG. 24. The UBMs 238 have bump portions on and extending along the major surface of the dielectric layer 236, and have via portions extending through the dielectric layer 236 to physically and electrically couple the metallization pattern 234. As a result, the UBMs 238 are electrically coupled to the through vias 216 and the package 195. The UBMs 238 may be formed of the same material as the metallization pattern 226. In some embodiments, the UBMs 238 have a different size than the metallization patterns 226, 230, and 234.

Conductive connectors 250 are formed on the UBMs 238. The respective process is also illustrated as process 910 in the process flow 900 as shown in FIG. 24. The conductive connectors 250 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 250 may include a conductive material such as solder, copper, aluminum, gold, nickel, silver, palladium, tin, the like, or a combination thereof. In some embodiments, the conductive connectors 250 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 250 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

The completed integrated fan out package components 200, such as package component 200A and package component 200B may be singulated in a subsequent process. The resulting package components 200 are integrated fan-out packages. In some embodiments additional package components may be attached to package components 200 prior to or after singulation.

Figure 18:
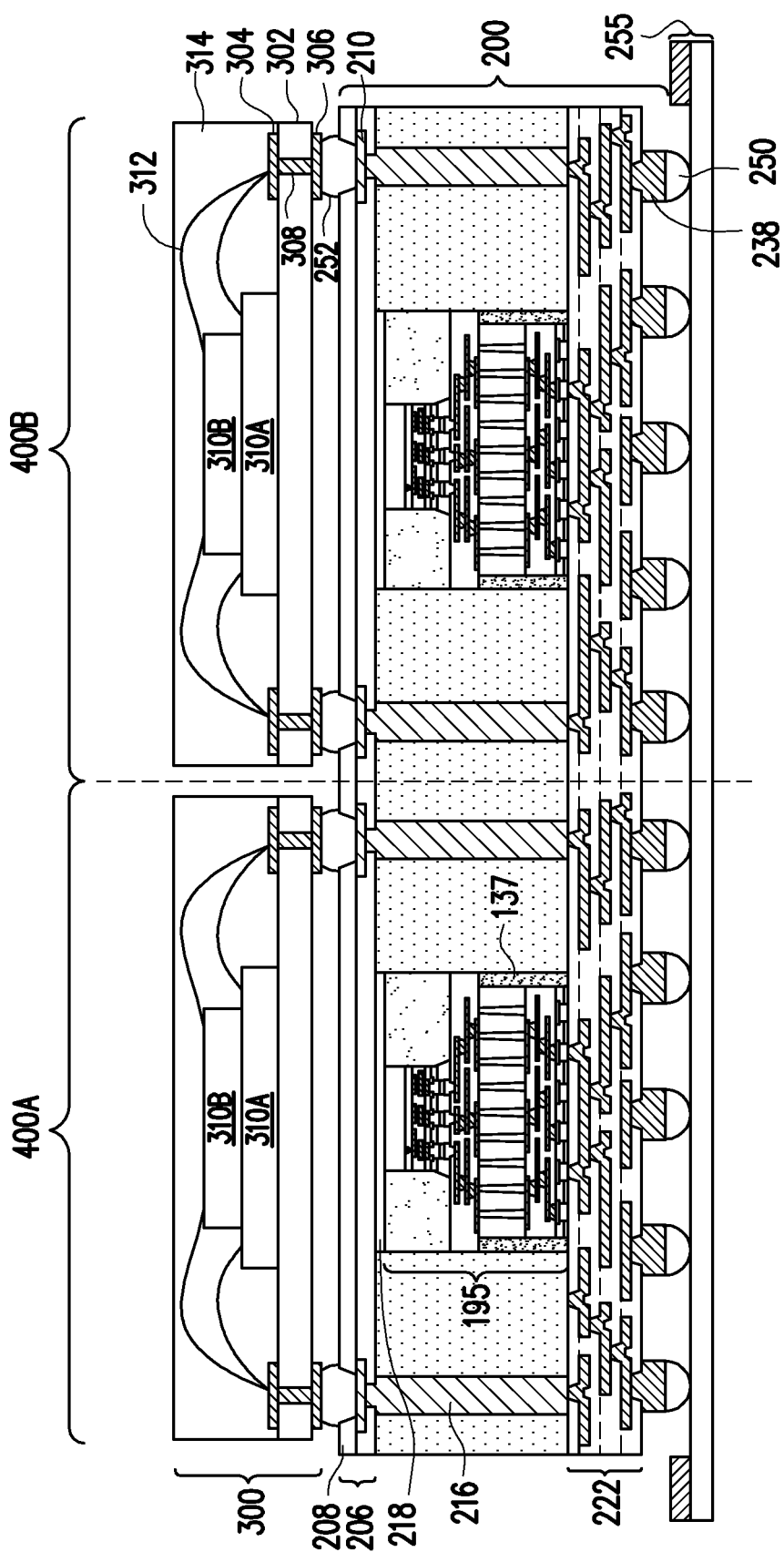

In FIG. 18, a carrier substrate de-bonding is performed to detach (or "de-bond") the carrier substrate 202 (FIG. 17) from the back-side redistribution structure 206, e.g., the dielectric layer 208. The respective process is illustrated as process 912 in the process flow 900 as shown in FIG. 24. In accordance with some embodiments, the de-bonding includes projecting a light such as a laser light or an UV light on the release layer 204 so that the release layer 204 decomposes under the heat of the light and the carrier substrate 202 can be removed. The structure is then flipped over and placed on tape 255.

To attach a second package component 300 to the package components 200, first, conductive connectors 252 are formed extending through the dielectric layer 208 to contact the metallization pattern 210 or in embodiments without a back-side redistribution structure 206, the conductive connectors 252 may contact the vias 216. Second package components 300 are coupled to the package components 200. The respective process is illustrated as process 914 in the process flow 900 as shown in FIG. 24. One of the second package components 300 is coupled in each of the first package regions 400A and the second package regions 400B to form an integrated circuit device stack 400 in each region of the package components 200. The integrated circuit device stack 400 is an integrated fan out package on package structure.

The second package components 300 include, for example, a substrate 302 and one or more stacked dies 310

(e.g., 310A and 310B) coupled to the substrate 302. Although one set of stacked dies 310 (310A and 310B) is illustrated, in other embodiments, a plurality of stacked dies 310 (each having one or more stacked dies) may be disposed side-by-side coupled to a same surface of the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate 302.

The substrate 302 may include active and passive devices (not shown). A wide variety of devices such as transistors, capacitors, resistors, combinations of these, and the like may be used to generate the structural and functional requirements of the design for the second package components 300. The devices may be formed using any suitable methods. The substrate 302 may also include metallization layers (not shown) and the conductive vias 308. In some embodiments, the substrate 302 is substantially free of active and passive devices.

The substrate 302 may have bond pads 304 on a first side of the substrate 302 to couple to the stacked dies 310, and bond pads 306 on a second side of the substrate 302, the second side being opposite the first side of the substrate 302, to couple to the conductive connectors 252. In the illustrated embodiment, the stacked dies 310 are coupled to the substrate 302 by wire bonds 312, although other connections may be used, such as conductive bumps. In an embodiment, the stacked dies 310 are stacked memory dies. For example, the stacked dies 310 may be memory dies such as low-power (LP) double data rate (DDR) memory modules, such as LPDDR1, LPDDR2, LPDDR3, LPDDR4, or the like memory modules.

The stacked dies 310 and the wire bonds 312 may be encapsulated by a molding material 314. The molding material 314 may be molded on the stacked dies 310 and the wire bonds 312, for example, using compression molding. In some embodiments, the molding material 314 is a molding compound, a polymer, an epoxy, silicon oxide filler material, the like, or a combination thereof. A curing process may be performed to cure the molding material 314; the curing process may be a thermal curing, a UV curing, the like, or a combination thereof.

After the second package components 300 are formed, the second package components 300 are mechanically and electrically bonded to the package component 200 by way of the conductive connectors 252, the bond pads 306, and a metallization pattern of the back-side redistribution structure 206. In some embodiments, the stacked dies 310 may be coupled to the packages 195 through the wire bonds 312, the bond pads 304 and 306, the conductive vias 308, the conductive connectors 252, the back-side redistribution structure 206, the through vias 216, and the front-side redistribution structure 222.

In some embodiments, an underfill (not shown) is formed between the package components 200 and the second package components 300, surrounding the conductive connectors 252. The underfill may reduce stress and protect the joints resulting from the reflowing of the conductive connectors 252. The underfill may be formed by a capillary flow process after the second package components 300 are attached, or may be formed by a suitable deposition method before the second package components 300 are attached.

A singulation process is performed by cutting along scribe line regions, e.g., between the first package region 400A and the second package region 400B using any suitable singulation technique, such as by sawing, laser cutting, or the like. The respective process is illustrated as process 916 in the process flow 900 as shown in FIG. 24. The cutting singulates the first package region 400A from the second package region 400B. The resulting singulated integrated circuit device stack 400 is from one of the first package region 400A or the second package region 400B. In some embodiments, the singulation process is performed after the second package components 300 are coupled to the package components 200. In other embodiments, the singulation process is performed before the second package components 300 are coupled to the package components 200, such as after the carrier substrate 202 is de-bonded and the conductive connectors 252 are formed.

Figure 19:
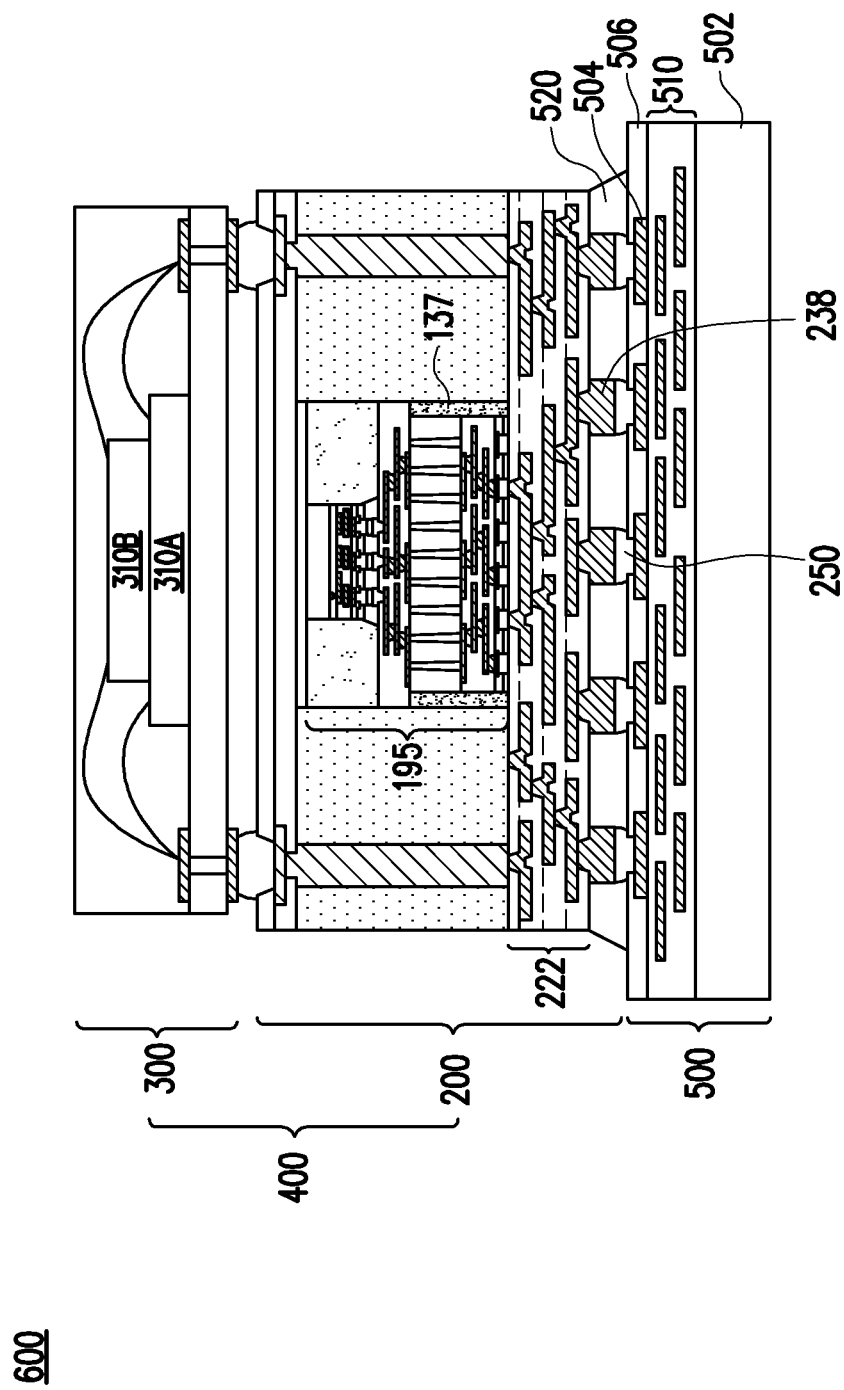

In FIG. 19, each integrated circuit device stack 400 may then be mounted to a package substrate 500 using the conductive connectors 250 to form 3D package 600. The respective process is also illustrated as process 918 in the process flow 900 as shown in FIG. 24. The package substrate 500 includes a substrate core 502 and bond pads 504 over the substrate core 502. The substrate core 502 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 502 may be an SOI substrate. Generally, an SOI substrate includes a layer of a semiconductor material such as epitaxial silicon, germanium, silicon germanium, SOI, SGOI, or combinations thereof. The substrate core 502 may be an organic substrate. The substrate core 502 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 502.

The substrate core 502 may include active and passive devices (not shown). A wide variety of devices such as transistors, capacitors, resistors, combinations of these, and the like may be used to generate the structural and functional requirements of the design for the device stack. The devices may be formed using any suitable methods. The substrate core 502 may also include a redistribution structure 510 including metallization layers and vias, with the bond pads 504 being physically and/or electrically coupled to the metallization layers and vias.

In some embodiments, the conductive connectors 250 are reflowed to attach the package component 200 to the bond pads 504. The conductive connectors 250 electrically and/or physically couple the package substrate 500, including metallization layers in the substrate core 502, to the package component 200. In some embodiments, a solder resist 506 is formed on the substrate core 502. The conductive connectors 250 may be disposed in openings in the solder resist 506 to be electrically and mechanically coupled to the bond pads 504. The solder resist 506 may be used to protect areas of the substrate core 502 from external damage.

The conductive connectors 250 may have an epoxy flux (not shown) formed thereon before they are reflowed with at least some of the epoxy portion of the epoxy flux remaining after the package component 200 is attached to the package substrate 500. This remaining epoxy portion may act as an underfill to reduce stress and protect the joints resulting from reflowing the conductive connectors 250. In some embodiments, an optional underfill 520 may be formed between the package component 200 and the package substrate 500 and surrounding the conductive connectors 250. The underfill 520 may be formed by a capillary flow process after the package component 200 is attached or may be formed by a suitable deposition method before the package component 200 is attached.

Figure 20:
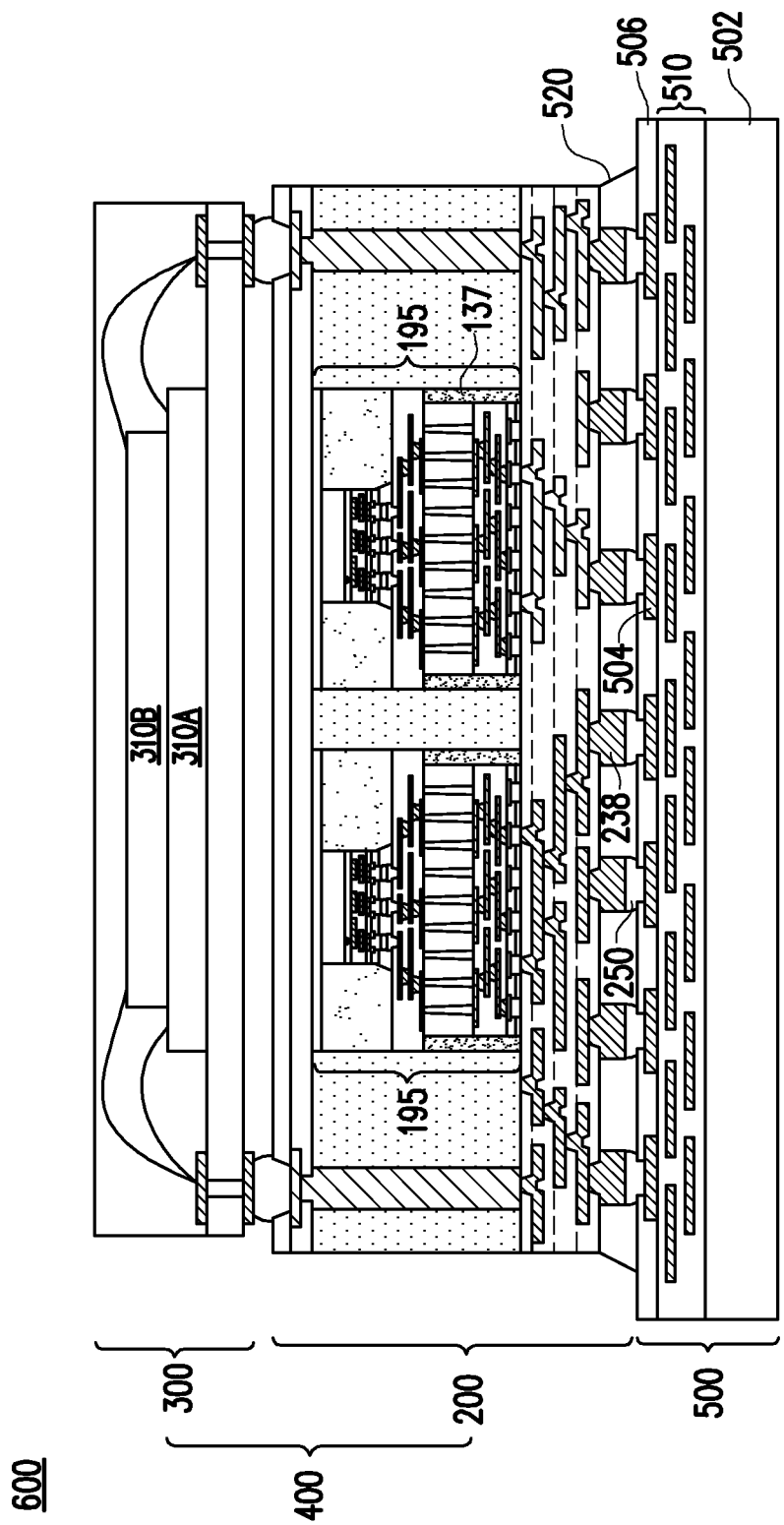

FIG. 20 illustrates a 3D package 600 having multiples of the package 195 embedded therein using an integrated fan-out package component 200. The process for forming the 3D package 600 of FIG. 20 is similar to the processes described above with respect to FIGS. 17 through 19, which are not repeated.

Figure 21:
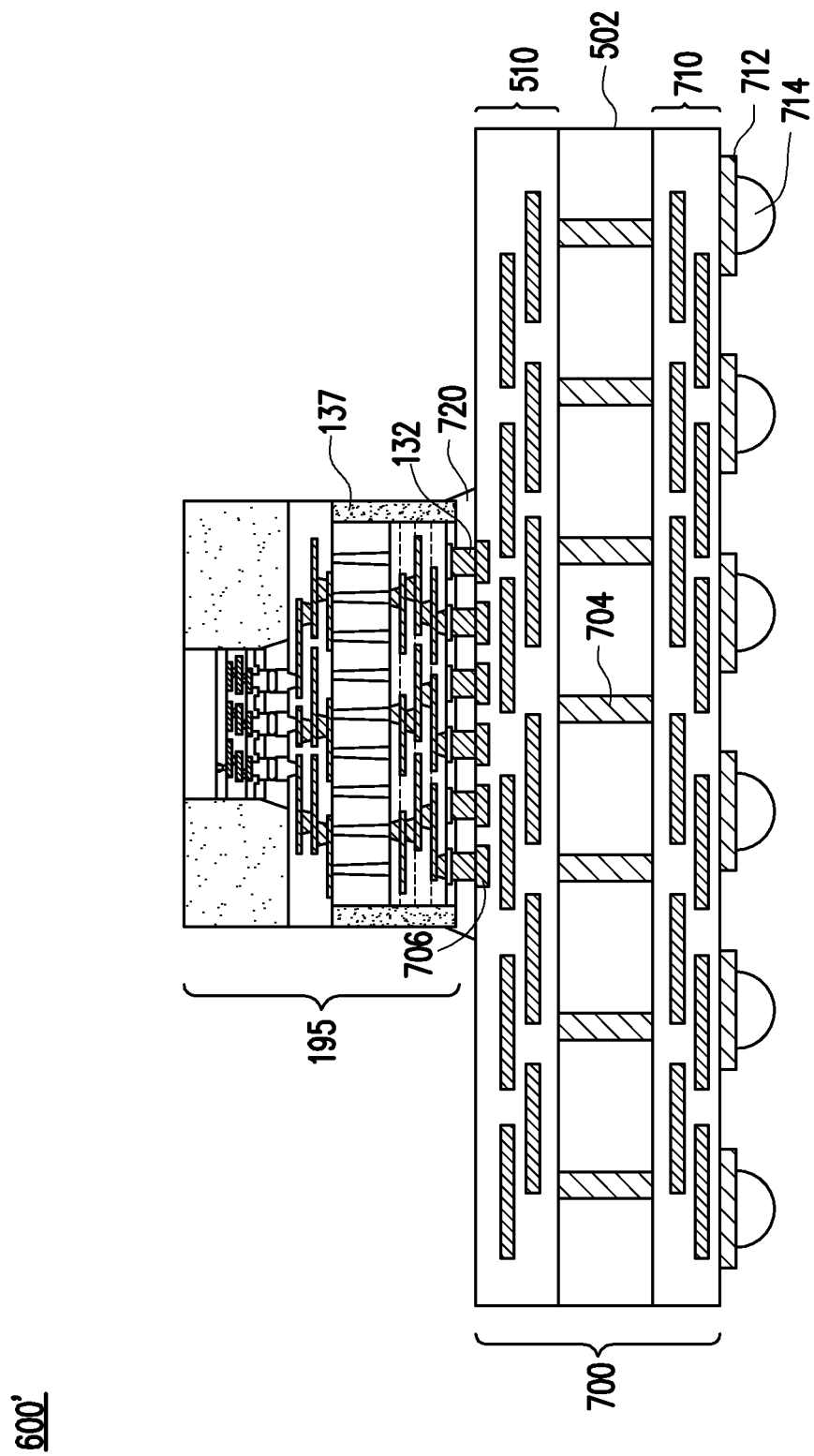
FIG. 21 illustrates a flip chip package, in accordance with some embodiments.

FIG. 21 illustrates the packages 195 bonded to a substrate 700 to form a flip chip package 600'. Although one of the packages 195 (including the packages 195A, 195B, 195C, 195D, and 195E) is illustrated as being bonded to substrate 700, it should understood that multiples of the packages 195 may be used in any combination. The packages 195 may be bonded by solder or by direct metal-to-metal bonding of the bond pads 132 with the substrate 700, or by any other suitable process. An optional underfill 720 similar to underfill 520 may be formed to surround the joints of the bond pads 132.

The substrate 700 may be any suitable substrate and may be similar to the package substrate 500 with like reference numbers designating like structures. The redistribution structure 510 may include contact pads 706 for receiving the packages 195. The substrate 700 may also include a second redistribution structure 710 disposed on an opposite side of the substrate core 502 than the redistribution structure 510. The second redistribution structure 710 may be formed using processes and materials similar to those used to form the redistribution structure 510. The substrate core 502 includes through-vias 704 which electrically couple the redistribution structure 510 to the second redistribution structure 710. The through-vias 704 may be formed by forming openings in the substrate core 502 by etching or laser-drilling or another suitable process and then filling the openings with a conductive material. A barrier layer material may also be used in the openings prior to depositing the conductive material to surround the conductive material in the openings.

The substrate 700 may also include contact pads 712 coupled to the second redistribution structure 710. Each of the contact pads 712 may also include a solder ball or a solder bump 714 disposed thereon to form a ball grid array on the bottom of the substrate 700. The ball grid array may be used for flip chip bonding. The solder bumps 714 may be formed by depositing a solder material on the contact pads 712 and reflowing the solder material.

Figure 22:
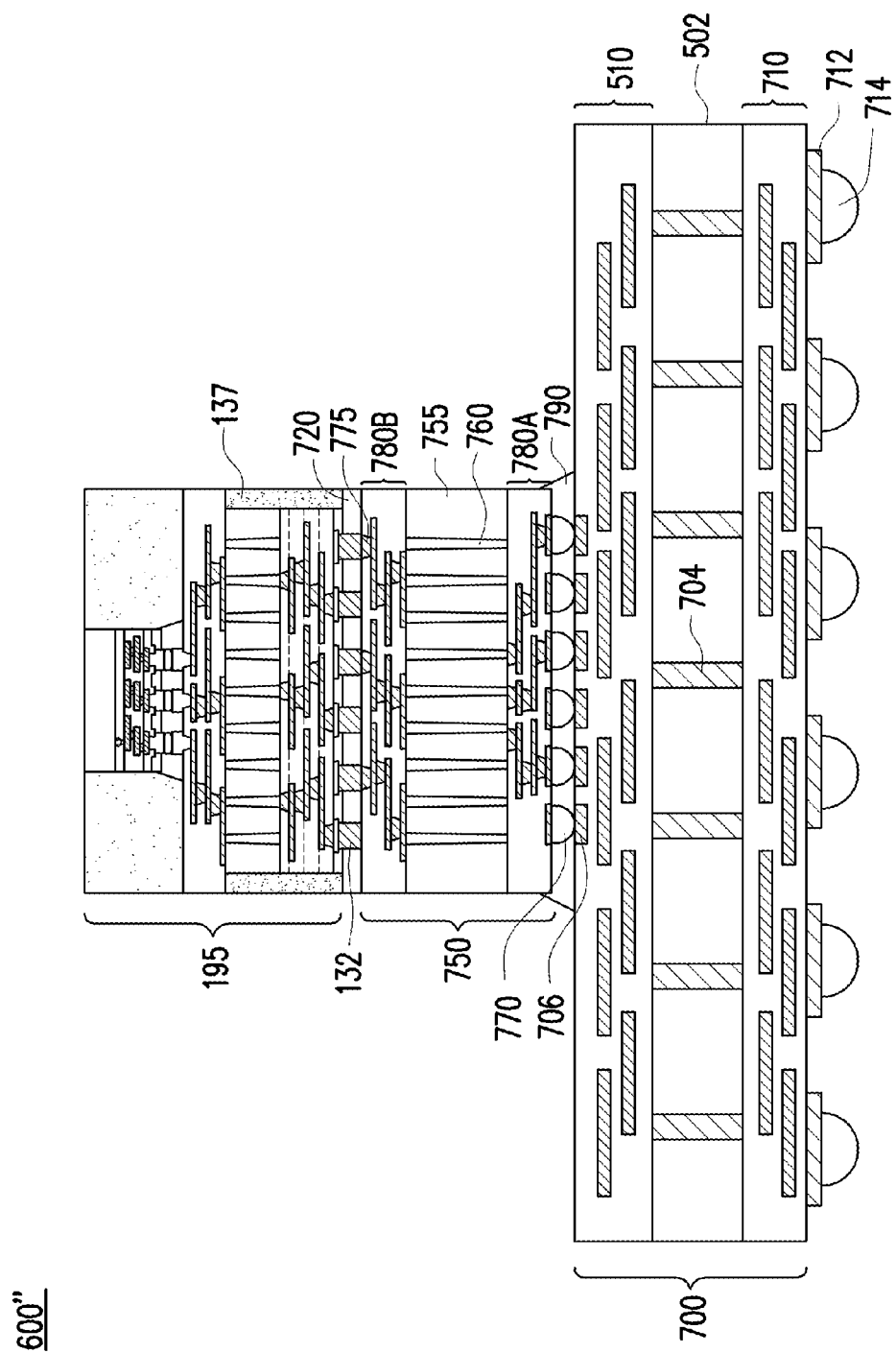
FIG. 22 illustrates a chip on wafer on substrate package, in accordance with some embodiments.

FIG. 22 illustrates the packages 195 bonded to an interposer 750 which is then bonded to a substrate 700 to form a chip on wafer on substrate (CoWoS) package 600". Although one of the packages 195 (including the packages 195A, 195B, 195C, 195D, and 195E) is illustrated as being bonded to interposer 750, it should understood that multiples of the packages 195 may be used in any combination. The packages 195 may be bonded by solder or by direct metal-to-metal bonding of the bond pads 132 with the interposer 750, or by any other suitable process. An optional underfill 720 similar to underfill 520 may be formed to surround the joints of the bond pads 132.

The interposer 750 includes a substrate core 755. The substrate core 755 may be an organic substrate, a ceramic substrate, a silicon substrate, or the like. The substrate core 755 may be formed of glass fiber, resin, filler, other materials, and/or combinations thereof. In some embodiments, the substrate core 755 includes one or more passive components (not shown) embedded inside. In another embodiment, the substrate core 755 may comprise other materials or components.

Conductive vias 760 extend through the substrate core 755. The conductive vias 760 comprise a conductive material such as copper, a copper alloy, or other conductors, and may include a barrier layer, liner, seed layer, and/or a fill material, in some embodiments. The conductive vias 760 provide vertical electrical connections from one side of the substrate core 755 to the other side of the substrate core 755. For example, some of the conductive vias 760 are electrically coupled between conductive features 770 at one side of the substrate core 755 and conductive features 775 at an opposite side of the substrate core 755. Holes for the conductive vias 760 may be formed using a drilling process, photolithography techniques, a laser process, or other methods, as examples, and the holes of the conductive vias 760 are then filled with conductive material.

Conductive features 775 may be, for example, conductive pads or under bump metallurgies. Conductive features 770 may be, for example, a ball grid array or other suitable conductive structure. Interposer 750 may also include redistribution structures 780A and 780B on opposing sides of the substrate core 755. The redistribution structures 780A and 780B are electrically coupled by the conductive vias 760. The redistribution structures 780A and 780B each include dielectric layers and metallization patterns similar to those discussed above with respect to the redistribution structures 206 of FIG. 17. Each respective metallization pattern has line portions on and extend along the major surface of a respective dielectric layer, and has via portions extending through the respective dielectric layer.

The illustrated interposer 750 is a portion of an interposer wafer which includes multiple sites similar to the illustrated interposer 750 for attaching the packages 195 which are singulated in a die saw process. In some embodiments, the packages 195 may be bonded to the interposer wafer, which is then singulated into combinations of the packages 195 and the interposer 750, which are then bonded to the substrate 700. In other embodiments, the interposer wafer may be singulated into the interposers 750 first, which the packages 195 are next bonded to, which are then bonded to the substrate 700. In yet other embodiments, the interposer 750 is bonded to the substrate 700 and then the packages 195 are bonded to the interposer 750.

In some embodiments, the substrate 700 may include features similar to those discussed above with respect to FIG. 21, with like reference numbers designating like structures. Other embodiments may omit one or more of the through-vias 704, the second redistribution structure 710, the contact pads 712, or the solder bumps 714, and may have features similar to those discussed above with respect to the package substrate 500 of FIG. 19. An optional underfill 790 similar to underfill 520 may be formed to surround the joints of the conductive features 770.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of the present disclosure have some advantageous features. By thinning the TSVs prior to attaching the integrated circuit device dies, the total thickness variation is reduced. The reduction in total thickness variation leads to better yield and accordingly, manufacturing cost is reduced. The chiplet device package can be formed using advanced technology nodes (i.e., high density patterning and device processes) and used in a manner similar to an integrated device die in a less advanced technology node. For example, the chiplet device package may be used in an InFO process to form an interconnect structure on a die stack including two or more dies stacked through bonding. Accordingly, the InFO interconnect structure may replace the conventional package substrate. The chiplet device package can also be used to form a flip chip package or a chip on wafer on substrate package. Advantages also include using die testing to reduce costs by only proceeding with dies that have passed testing. Dies which have passed testing can be singulated from dies which have failed testing, attached to a carrier substrate, and used to attach known good dies to form a 3D package (chiplet). Yield is increased and costs are reduced.

One embodiment is a method including forming a set of through-vias in a substrate, the set of through-vias partially penetrating a thickness of the substrate. The method also includes forming first connectors over the set of through-vias on a first side of the substrate. The method also includes singulating a first die from the substrate. The method also includes attaching a first side of the first die to a carrier. The method also includes laterally encapsulating the first die in a first encapsulant and thinning a second side of the first die to expose the set of through-vias. The method also includes forming second connectors over the set of through-vias on the second side of the first die, the second side opposite the first side. The method also includes bonding a device die to the second connectors. The method also includes cutting through the first encapsulant to singulate the first die and the device die into a package. In an embodiment, the first die is one of a plurality of dies of the substrate, the method further including: testing the plurality of dies; determining that the first die passes the testing; and retaining the first die and discarding one or more rejected dies of the plurality of dies. In an embodiment, testing the plurality of dies is performed prior to singulating the first die from the substrate. In an embodiment, a first interconnect is formed over the set of through-vias, the first interconnect interposed between the set of through-vias and the second connectors, the first interconnect having an interface with the first encapsulant. In an embodiment, the first interconnect has an interface with the second die, where following cutting through the first encapsulant to singulate the first die and the device die into the package, the package includes the second die. In an embodiment, after cutting through the first encapsulant to singulate the first die and the device die into the package, the package includes multiple device dies. In an embodiment, the method further includes attaching the package to another carrier; forming a redistribution structure over the package; forming third connectors over the redistribution structure; and singulating the package and the redistribution structure into an integrated fan out package. In an embodiment, after cutting through the first encapsulant to singulate the first die and the device die into the package, the package includes multiple device dies. In an embodiment, the package is attached to another substrate to form a flip chip package. In an embodiment, the package is attached to an interposer wafer, the interposer wafer is bonded to another substrate; and the interposer wafer, the another substrate, and the package are singulated into a chip on wafer on substrate package.

Another embodiment is a method including testing, by first connectors, a first die of a first substrate and a second die of the first substrate. The method also includes determining the first die and the second die to pass the testing. The method also includes separating the first die of the first substrate from the second die of the first substrate. The method also includes attaching a first side of the first die and a first side of the second die to a carrier, the first side of the first die and the first side of the second die including the first connectors. The method also includes filling a gap between the first die and the second die with a gap filling material, the gap filling material surrounding the first die and the second die. The method also includes thinning a second side of the first die to expose a first set of via structures. The method also includes forming an interconnect over the first set of via structures. The method also includes electrically coupling one or more device dies to the interconnect. The method also includes cutting through the gap filling material to singulate the first die and the second die from other dies embedded in the gap filling material to form a first package. In an embodiment, the first set of via structures taper, being narrower closer to the device die and wider further from the device die. In an embodiment, the first package includes the first die and the second die. In an embodiment, the first package is attached to a substrate on an opposite side of theft substrate from a ball grid array to form a flip chip package. In an embodiment, the first package is attached to an interposer wafer, the interposer wafer is bonded to a substrate, and the interposer wafer, the substrate, and the package are singulated into a chip on wafer on substrate package.

Another embodiment is a structure including a first die, the first die including: a first material layer, a first set of through-vias embedded in the first material layer, the first set of through-vias having a width which expands wider from top to bottom, a first set of connectors disposed over a first side of the first material layer, and a second set of connectors disposed under a second side of the first material layer. The structure also includes a first semiconductor device coupled to the first set of connectors. The structure also includes a first encapsulant laterally surrounding the first semiconductor device. The structure also includes a second encapsulant laterally surrounding the first die. In an embodiment, an interconnect structure is interposed between the first die and the first semiconductor device, the interconnect structure including a dielectric material and metal lines disposed within dielectric material, where sidewalls of the first die include the first encapsulant, the dielectric material, and the second encapsulant. In an embodiment, one or more additional semiconductor devices are embedded in the first encapsulant, or one or more additional dies are embedded in the second encapsulant. In an embodiment, a device substrate is electrically coupled to the second set of connectors, the device substrate including a ball grid array including a flip chip package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a set of through-vias in a substrate, the set of through-vias partially penetrating a thickness of the substrate;
   forming first connectors over the set of through-vias on a first side of the substrate;
   singulating a first die from the substrate, the first die having a front side and a back side, the front side including the first connectors, the back side opposite the front side;
   attaching the front side of the first die to a carrier, wherein after attaching the front side of the first die to the carrier, the front side of the first die has an interface with the carrier;
   laterally encapsulating the first die in a first encapsulant;
   thinning the back side of the first die to expose the set of through-vias;
   forming second connectors over the set of through-vias on the back side of the first die;
   bonding multiple device dies to the second connectors[[, wherein after cutting through the first encapsulant to singulate the first die and the device die into the package, the package comprises the multiple device dies]]; and
   cutting through the first encapsulant to singulate the first die and the device die into a package;
   wherein after cutting through the first encapsulant to singulate the first die and the device die into the package, the package comprises the multiple device dies.

2. The method of claim 1, wherein the first die is one of a plurality of dies of the substrate, further comprising:
   testing the plurality of dies;
   determining that the first die passes the testing; and
   retaining the first die and discarding one or more rejected dies of the plurality of dies.

3. The method of claim 2, wherein the testing the plurality of dies is performed prior to singulating the first die from the substrate.

4. The method of claim 1, further comprising:
   forming a first interconnect over the set of through-vias, the first interconnect interposed between the set of through-vias and the second connectors, the first interconnect having an interface with the first encapsulant.

5. The method of claim 4, further comprising:
   attaching a first side of a second die to the carrier, wherein the first interconnect has an interface with the second die, wherein following cutting through the first encapsulant to singulate the first die and the multiple device dies into the package, the package including the second die.

6. The method of claim 1, further comprising:
   attaching the package to another carrier;
   forming a redistribution structure over the package;
   forming third connectors over the redistribution structure; and
   singulating the package and the redistribution structure into an integrated fan out package.

7. The method of claim 1, further comprising:
   attaching the package to another substrate to form a flip chip package.

8. The method of claim 1, further comprising:
   attaching the package to an interposer wafer;
   bonding the interposer wafer to another substrate; and
   singulating the interposer wafer, the another substrate, and the package into a chip on wafer on substrate package.

9. The method of claim 1, further comprising
   releasing the package containing the first die and the multiple device dies by a dicing process, a portion of the first encapsulant remaining on a sidewall of the substrate of the first die.

10. The method of claim 9, further comprising:
    prior to releasing the package, depositing a second encapsulant to laterally surround the multiple device dies, wherein the dicing process cuts through the second encapsulant and the first encapsulant.

11. A method comprising:
    testing, by first connectors, a first die of a first substrate and a second die of the first substrate;
    determining the first die and the second die to pass the testing;
    separating the first die of the first substrate from the second die of the first substrate;
    attaching a first side of the first die and a first side of the second die to a carrier, the first side of the first die and the first side of the second die comprising the first connectors;
    filling a gap between the first die and the second die with a gap filling material, the gap filling material surrounding the first die and the second die;
    thinning a second side of the first die to expose a first set of via structures;
    forming an interconnect over the first set of via structures;
    electrically coupling one or more device dies to the interconnect; and
    cutting through the gap filling material to singulate the first die and the second die from other dies embedded in the gap filling material to form a first package.

12. The method of claim 11, wherein the first set of via structures taper, being narrower at first ends of the first set of via structures and wider at second ends of the first set of via structures, wherein the first ends are closer to the one or more device dies than the second ends.

13. The method of claim 11, wherein the first package includes the first die and the second die.

14. The method of claim 11, further comprising:

attaching the first package to a substrate on an opposite side of the substrate from a ball grid array to form a flip chip package.

15. The method of claim 11, further comprising:

attaching the first package to an interposer wafer;

bonding the interposer wafer to a substrate; and singulating the interposer wafer, the substrate, and the first package into a chip on wafer on substrate package.

16. A method comprising:

mounting a first die to a carrier, the first die including a first set of vias embedded in a first material layer, the first set of vias having a width which expands from a first side of the first material layer toward a second side of the first material layer, the first die mounted to the carrier by the second side of the first material layer;

laterally encapsulating the first die in a first encapsulant;

thinning the first encapsulant and the first material layer to expose the first set of vias;

forming a first set of connectors disposed over the first side of the first material layer;

coupling a first semiconductor device to the first set of connectors; and depositing a second encapsulant to laterally surround the first semiconductor device; and cutting through the first encapsulant and the second encapsulant to release a package containing the first die and the first semiconductor device, a portion of the first encapsulant remaining on a sidewall of the first material layer of the first die.

17. The method of claim 16, further comprising:

removing the carrier and forming a second set of connectors disposed under the second side of the first material layer.

18. The method of claim 16, further comprising:

forming a first interconnect over the first set of vias and first encapsulant, the first semiconductor device coupled to the first interconnect.

19. The method of claim 18, wherein a portion of the first interconnect is interposed between the first encapsulant and the second encapsulant.

20. The method of claim 16, wherein a portion of the first semiconductor device overlaps the first encapsulant.

\* \* \* \* \*

UNITED STATES PATENT AND TRADEMARK OFFICE
CERTIFICATE OF CORRECTION

| | | |
|---|---|---|
| PATENT NO. | : 11,929,261 B2 | Page 1 of 1 |
| APPLICATION NO. | : 17/097857 | |
| DATED | : March 12, 2024 | |
| INVENTOR(S) | : Chin-Chuan Chang | |

It is certified that error appears in the above-identified patent and that said Letters Patent is hereby corrected as shown below:

In the Claims

In Column 23, Line 45, Claim No. 1:
Change "bonding multiple device dies to the second connectors[[, wherein after cutting through the first encapsulant to singulate the first die and the device die into the package, the package comprises the multiple device dies]]; and"
To --bonding multiple device dies to the second connectors; and--

Signed and Sealed this
Seventh Day of May, 2024

Katherine Kelly Vidal
*Director of the United States Patent and Trademark Office*